(12) United States Patent
Arakawa et al.

(10) Patent No.: US 9,054,002 B2
(45) Date of Patent: Jun. 9, 2015

(54) METHOD FOR MANUFACTURING PHOTOELECTRIC CONVERSION DEVICE

(75) Inventors: Mikio Arakawa, Ebina (JP); Masataka Ito, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/569,640

(22) Filed: Aug. 8, 2012

(65) Prior Publication Data

US 2013/0040415 A1  Feb. 14, 2013

(30) Foreign Application Priority Data

Aug. 12, 2011  (JP) ................. 2011-177126

(51) Int. Cl.
  *H01L 21/00* (2006.01)
  *H01L 27/146* (2006.01)

(52) U.S. Cl.
  CPC ...... *H01L 27/1463* (2013.01); *H01L 27/14627* (2013.01); *H01L 27/14685* (2013.01)

(58) Field of Classification Search
  CPC .............. H01L 27/1462; H01L 27/14685
  USPC .................................. 438/401, 69
  See application file for complete search history.

(56) References Cited

U.S. PATENT DOCUMENTS

| | | | |
|---|---|---|---|
| 7,588,993 B2* | 9/2009 | Liu et al. ............ | 438/401 |
| 2002/0121652 A1 | 9/2002 | Yamasaki | |
| 2004/0005729 A1 | 1/2004 | Abe | |
| 2005/0012166 A1* | 1/2005 | Choi ................. | 257/414 |
| 2007/0297063 A1* | 12/2007 | Jacobowitz et al. .... | 359/619 |
| 2008/0038864 A1 | 2/2008 | Yoo | |
| 2009/0137092 A1* | 5/2009 | Narita et al. ......... | 438/401 |
| 2010/0038523 A1* | 2/2010 | Venezia et al. ....... | 250/216 |
| 2011/0127629 A1* | 6/2011 | Yorikado et al. ...... | 257/432 |
| 2011/0186951 A1* | 8/2011 | Pyo .................. | 257/432 |

FOREIGN PATENT DOCUMENTS

| | | | |
|---|---|---|---|
| JP | 2001-250931 A | 9/2001 | |
| JP | 2002-165126 A | 6/2002 | |
| JP | 2003-273342 A | 9/2003 | |
| JP | 2003-273343 A | 9/2003 | |

* cited by examiner

*Primary Examiner* — William D Coleman
(74) *Attorney, Agent, or Firm* — Canon USA Inc. IP Division

(57) ABSTRACT

A process of forming an isolation region that defines an active region on a semiconductor wafer, a process of forming a photoelectric conversion element in the active region defined by the isolation region, and a process of forming a micro lens over the photoelectric conversion element are provided. Alignment in the process of forming the photoelectric conversion element and alignment in the process of forming the micro lens are performed using an alignment mark formed in the process of forming the isolation region.

20 Claims, 12 Drawing Sheets

METHOD FOR MANUFACTURING PHOTOELECTRIC CONVERSION DEVICE

BACKGROUND OF THE INVENTION

1. Field of the Invention

The present invention relates to a method for manufacturing a photoelectric conversion device, and more specifically to micro-lens alignment.

2. Description of the Related Art

Typical examples of photoelectric conversion devices include complementary metal oxide semiconductor (CMOS) image sensors and charge coupled device (CCD) image sensors. Such typical photoelectric conversion devices include micro lenses that collect light incident on photoelectric conversion elements.

Japanese Patent Laid-Open No. 2003-273342 discloses that an isolation region is formed and a photoelectric conversion element is formed using the isolation region as a reference of alignment. Japanese Patent Laid-Open No. 2003-273342 further discloses that a gate layer is formed using the isolation region as a reference of alignment and that each contact plug layer is formed using the gate layer as a reference of alignment. It is also disclosed that a color filter is formed by performing alignment using the gate layer as a reference and that an on-chip lens (micro lens) is formed by performing alignment using the color filter as a reference.

In the method described in Japanese Patent Laid-Open No. 2003-273342, when a micro lens is to be formed, alignment errors that can be caused during previous alignments are accumulated through the formation of the gate layer and the formation of the color filter. As a result, the relative positional relationship between the photoelectric conversion element and the micro lens may be significantly deviated from the design value.

Such deviation may lead to a reduction in the performance of the photoelectric conversion device, such as the occurrence of crosstalk or a reduction in sensitivity as a distance (pixel pitch) between a plurality of photoelectric conversion elements decreases.

SUMMARY OF THE INVENTION

The present invention provides, in an aspect, a method for manufacturing a photoelectric conversion device, including the processes of forming an isolation region that defines an active region on a semiconductor wafer; forming a photoelectric conversion element in the active region defined by the isolation region; and forming a micro lens over the photoelectric conversion element. Alignment in the process of forming the photoelectric conversion element and alignment in the process of forming the micro lens are performed using an alignment mark formed in the process of forming the isolation region.

Further features of the present invention will become apparent from the following description of exemplary embodiments with reference to the attached drawings.

DESCRIPTION OF THE EMBODIMENTS

Figure 1A:
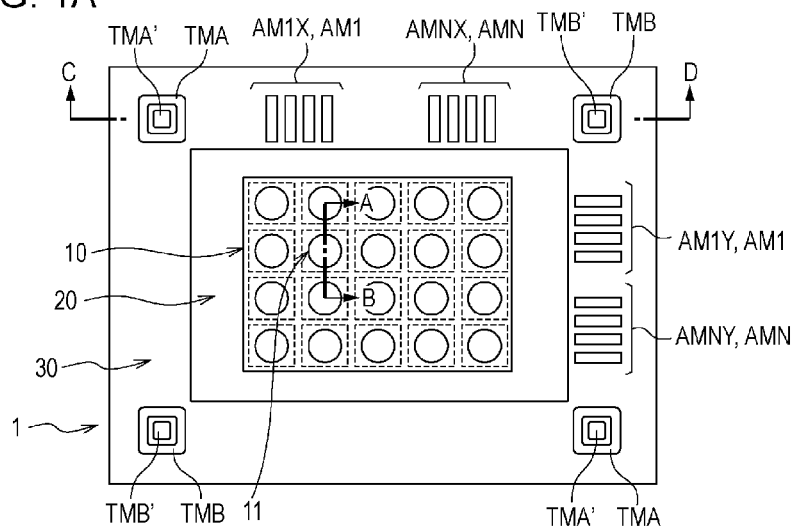
FIGS. 1A and 1B are schematic diagrams illustrating an example of a photoelectric conversion device according to the present invention.

First, an overview of an example of a photoelectric conversion device according to the present invention will be described. FIG. 1A is a plan view of a photoelectric conversion device 1. The photoelectric conversion device 1 includes a light receiving section 10 having a plurality of light receiving units 11. In FIG. 1A, the plurality of light receiving units 11 are arranged in a two-dimensional array in the light receiving section 10, by way of example. However, the plurality of light receiving units 11 may be arranged in a one-dimensional array.

The photoelectric conversion device 1 may be used exclusively as an imaging device (image sensor), or may be used exclusively as a distance measurement device (also called a focus detection device) or a light metering device. The photoelectric conversion device 1 may also be used as a multi-function device that serves as an imaging device and at least one of a distance measurement device and a light metering device.

Figure 1B:
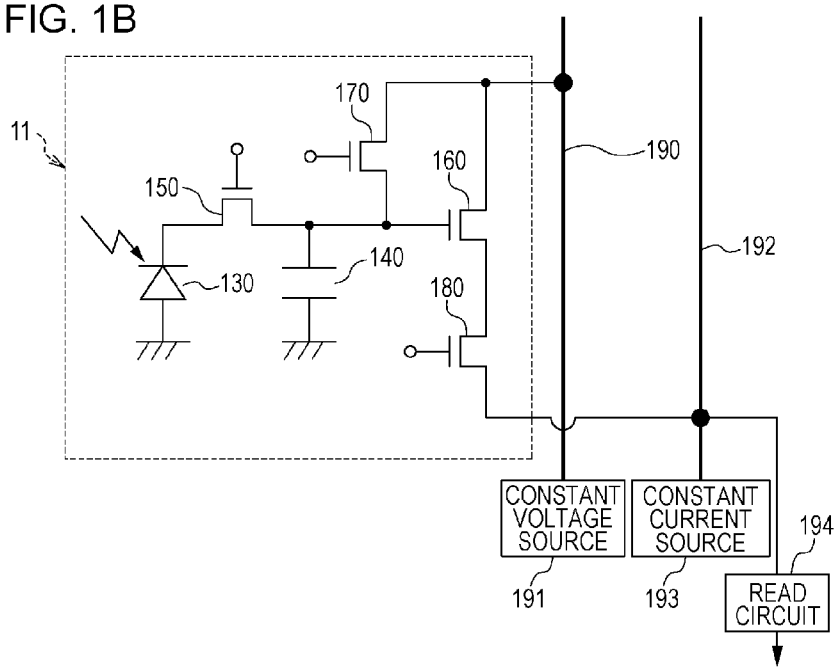

The photoelectric conversion device 1 will be described hereinafter in the context of a so-called pixel-amplification imaging device such as a CMOS image sensor, by way of example. In the imaging device, one light receiving unit 11 corresponds to one of a plurality of pixels. In FIGS. 1A and 1B, each pixel is surrounded by a dotted line to separate it from the other pixels.

As illustrated in FIG. 1A, the photoelectric conversion device 1 may include, in addition to the light receiving section 10, a peripheral circuit section 20 including peripheral circuits that drive pixel circuits provided in the light receiving section 10 and that process signals obtained by the light receiving section 10. The photoelectric conversion device 1 may further include a mark section 30 in which alignment marks and test marks used in the process of manufacturing the photoelectric conversion device 1 are formed.

FIG. 1B illustrates an exemplary circuit diagram of the photoelectric conversion device 1. Each of the light receiving units 11 has one photoelectric conversion element 130. A capacitor part 140 is connected to the photoelectric conversion element 130 through a transfer transistor 150. The capacitor part 140 is connected to a control electrode (or gate) of an amplifier transistor 160. The capacitor part 140 is connected to one main electrode (e.g., source) of a reset transistor 170. One main electrode (e.g., drain) of the amplifier transistor 160 and the other main electrode (e.g., drain) of the reset transistor 170 are connected to a power supply line 190 to which a constant voltage source 191 is connected. The other main electrode (e.g., source) of the amplifier transistor 160 is connected to an output line 192 through a selection transistor 180. A constant current source 193 is connected to the output line 192, and the amplifier transistor 160 forms a source follower circuit. A voltage corresponding to the voltage at the gate of the amplifier transistor 160 appears on the output line 192, and is read by a read circuit 194. The constant voltage source 191, the constant current source 193, and the read circuit 194 may be arranged in the peripheral circuit section 20. The read circuit 194 includes a clamp circuit, a sample and hold circuit, a buffer circuit, an analog-to-digital (A/D) conversion circuit, and any other suitable circuit, if necessary.

In FIG. 1B, each pixel circuit is composed of four transistors including the transfer transistor 150, the amplifier transistor 160, the reset transistor 170, and the selection transistor 180, by way of example. Alternatively, each pixel circuit may be composed of three transistors, excluding the selection transistor 180. Alternatively, each pixel circuit may not include the capacitor part 140 or the transfer transistor 150, and the photoelectric conversion element 130 may be connected directly to the gate of the amplifier transistor 160. Furthermore, the amplifier transistor 160 and the reset transistor 170 may not necessarily be provided in each pixel, and the so-called pixel sharing structure may be used.

Figure 2A:
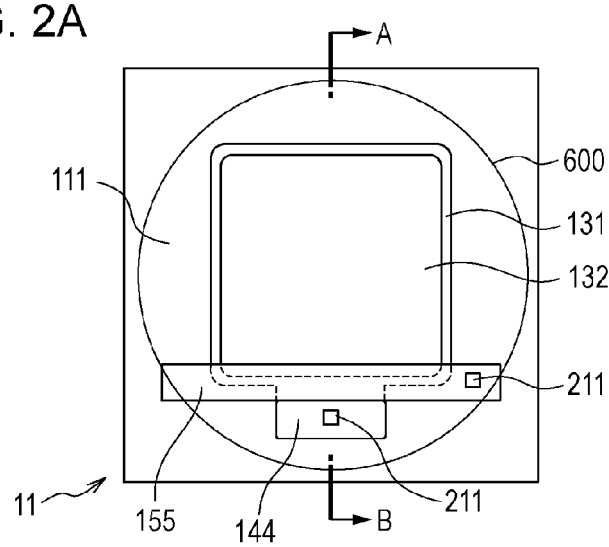
FIGS. 2A and 2B are schematic diagrams illustrating an example of the photoelectric conversion device according to the present invention.
Figure 2B:
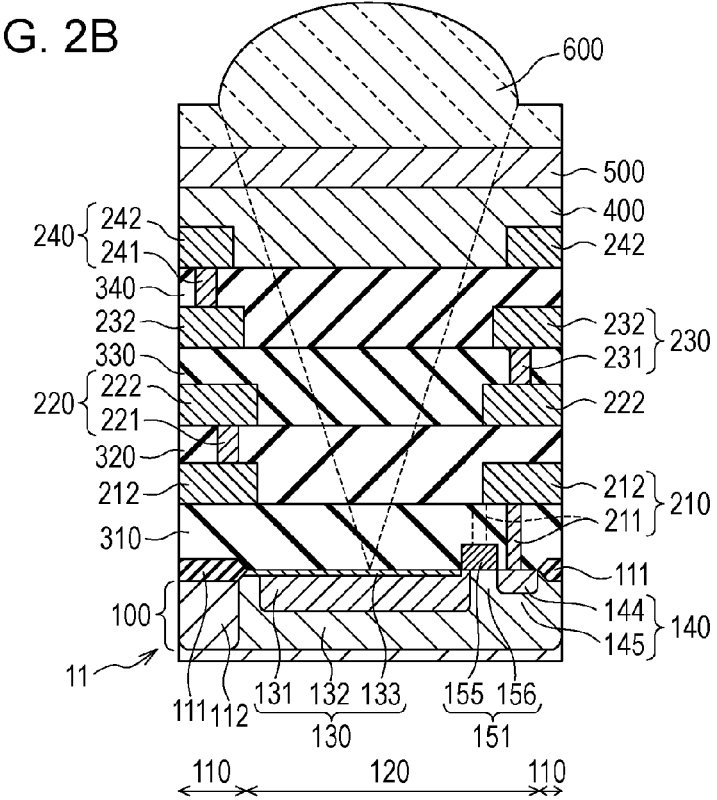

FIG. 2A is a plan view of one of the light receiving units 11 illustrated in FIG. 1A, and FIG. 2B is a cross-sectional view of the light receiving unit 11, taken along line A-B in FIGS. 1A and 2A. The following description will be given with cross-reference to FIGS. 2A and 2B.

The photoelectric conversion device 1 includes a semiconductor substrate 100. The semiconductor substrate 100 has an isolation region 110 (element isolation region) and an active region 120, and the isolation region 110 defines the active region 120. An isolation insulator 111 is provided in the isolation region 110. The isolation insulator 111 is typically a so-called field oxide film. Specifically, the isolation insulator 111 is an insulator that a thermal oxide film formed by the Local Oxidation of Silicon (LOCOS) method, a Shallow Trench Isolation (STI) buried oxide film, or a similar element isolation structure has.

The photoelectric conversion element 130 is provided in the active region 120 on the semiconductor substrate 100. A micro lens 600 is provided above the photoelectric conversion element 130. Each light receiving unit 11 at least includes one photoelectric conversion element 130 and one micro lens 600 corresponding to the photoelectric conversion element 130. That is, one light receiving unit 11 is defined by a set of a photoelectric conversion element 130 and a micro lens 600.

In the illustrated example, the photoelectric conversion element 130 has a first-conductivity-type first semiconductor region 131 and a second-conductivity-type second semiconductor region 132. The first semiconductor region 131 and the second semiconductor region 132 form a PN junction, and function as photoelectric conversion regions where signal charge is generated. Thus, the first semiconductor region 131 and the second semiconductor region 132 may be collectively referred to as a photoelectric conversion unit of the photoelectric conversion element 130. The first semiconductor region 131 also functions as an accumulation region where the signal charge generated in the first semiconductor region 131 and the signal charge generated in the second semiconductor region 132 are accumulated. In the illustrated example, the photoelectric conversion element 130 further has a second-conductivity-type third semiconductor region 133 disposed between a surface of the semiconductor substrate 100 and the first semiconductor region 131. The third semiconductor region 133 functions as a surface region for reduction in dark current. In this manner, the photoelectric conversion element 130 in the illustrated example has a pinned photodiode (photoelectric conversion unit). A photogate may also be used in the configuration of the photoelectric conversion element 130.

As used herein, the term "first conductivity type" refers to a conductivity type with the signal charge residing as majority carriers, and the term "second conductivity type" refers to a conductivity type with the signal charge residing as minority carriers. If the signal charge resides as electrons, N-type is the first conductivity type and P-type is the second conductivity type. If the signal charge resides as holes, P-type is the first conductivity type and N-type is the second conductivity type. While in the following description, the signal charge resides as electrons, the signal charge may reside as holes.

The active region 120 further has a second-conductivity-type fifth semiconductor region 145 and a first-conductivity-type fourth semiconductor region 144. The fourth semiconductor region 144 and the fifth semiconductor region 145 form a PN junction, and the fourth semiconductor region 144 functions as a floating diffusion region. The fourth semiconductor region 144 and the fifth semiconductor region 145 may be included in part of the capacitor part 140. The active region 120 further has a second-conductivity-type sixth semiconductor region 156 functioning as a channel region between the first semiconductor region 131 and the third semiconductor region 144. A control electrode 155 (gate electrode) is disposed above the sixth semiconductor region 156 through a gate insulating film (not illustrated), and a transfer gate 151 of the transfer transistor 150 is formed. A source of the transfer transistor 150 is substantially the first semiconductor region 131 (the accumulation region of the photoelectric conversion element 130), and a drain of the transfer transistor 150 is substantially the fourth semiconductor region 144 (floating diffusion region).

The second semiconductor region 132, the fifth semiconductor region 145, and the sixth semiconductor region 156, which are second-conductivity-type semiconductor regions, may be continuously formed, and these second-conductivity-type semiconductor regions may be collectively referred to as a well region. The isolation region 110 includes, beneath the isolation insulator 111, a second-conductivity-type seventh semiconductor region 112 having an impurity concentration higher than the impurity concentration of the second semiconductor region 132. The amplifier transistor 160, the reset transistor 170, and the selection transistor 180, described above, may be disposed in another active region (not illustrated) that is isolated by the isolation region 110 from the active region 120 where the photoelectric conversion element 130 is disposed. The seventh semiconductor region 112 functions as a potential barrier from the well region of the active region 120 to the other active region. Therefore, the seventh semiconductor region 112 may be regarded as defining the range of the well region, for example, the second semiconductor region 132.

In the illustrated example, the light receiving section 10 has four metal layers between the semiconductor substrate 100 and the micro lens 600, including a first metal layer 210, a second metal layer 220, a third metal layer 230, and a fourth metal layer 240. The first metal layer 210 has a first metal plug 211 connected to the control electrode 155 and the fourth semiconductor region 144, and a first metal interconnection 212 connected to the first metal plug 211. The first metal plug 211 is also connected to the control electrodes (gate) and main electrodes (source, drain) of transistors other than the transfer transistor 150, or to the well region. The second metal layer 220 is disposed on top of the first metal layer 210. The second metal layer 220 has a second metal plug 221 connected to the first metal interconnection 212, and a second metal interconnection 222 connected to the second metal plug 221. The third metal layer 230 is disposed on top of the second metal layer 220. The third metal layer 230 has a third metal plug 231 connected to the second metal interconnection 222, and a third metal interconnection 232 connected to the third metal plug 231. The fourth metal layer 240 is disposed on top of the third metal layer 230. The fourth metal layer 240 has a fourth metal plug 241 connected to the third metal interconnection 232, and a fourth metal interconnection 242 connected to the fourth metal plug 241.

The first metal layer 210, the second metal layer 220, the third metal layer 230, and the fourth metal layer 240 form a metal structure. In the illustrated example, the metal structure functions as a multilayer interconnection for the interconnection between individual transistors of each pixel circuit or between pixel circuits and peripheral circuits. While four metal layers are used here, a generalized representation, i.e., N metal layers, where N≥2, may be used. Of the N metal layers, as described above, the first metal layer 210 is a metal layer to be connected to the control electrode and/or main electrodes of transistors disposed on the semiconductor substrate 100. Of the N metal layers, the N-th metal layer is the metal layer closest to the micro lens 600. In the illustrated example, the N-th metal layer (in the illustrated example, the fourth metal layer 240) is connected to the (N−1)-th metal layer (in the illustrated example, the third metal layer 230). However, the N-th metal layer, which is the metal layer closest to the micro lens 600, may not necessarily be connected to the (N−1)-th metal layer, and may be electrically floating. The peripheral circuit section 20 can also include N metal layers, or may include a larger number of metal layers (for example, N+1 metal layers) than the light receiving section 10.

In the illustrated example, each metal layer is composed of a metal plug and a metal interconnection. However, each metal layer may be composed of only a metal interconnection, or may be composed of only a metal plug. For example, a metal interconnection in an upper layer may be connected directly to a metal interconnection in a lower layer without using a metal plug. Alternatively, for example, only a metal plug may be formed on top of a metal interconnection in a lower layer, and may be used as a dummy pattern. In the relationship between a metal interconnection and a metal plug that are in a single metal layer, the metal plug is connected to the metal interconnection and is disposed on the semiconductor substrate 100 side with respect to the metal interconnection. In the description of each metal layer having a metal plug and a metal interconnection in connection with a manufacturing method described below, the metal interconnection is formed after the metal plug has been formed. Each metal layer is mainly made of a metal material such as a pure metal or an alloy, and part of each metal layer may be made of a metal compound material such as a nitride. In each metal layer, the metal interconnection and the metal plug may be made of the same material or may be made of different materials. For example, the metal interconnection and the metal plug in the same metal layer may be made of copper, or the metal plug and the metal interconnection in the same metal layer may be made of tungsten and aluminum, respectively. The metal interconnections in the same metal layer of the light receiving section 10 may have a pattern in which the metal interconnections are separated into a plurality of portions by an insulating layer or may have a lattice pattern in which the metal interconnections are continuous across substantially the entirety of the light receiving section 10.

In the illustrated example, a first insulating layer 310, a second insulating layer 320, a third insulating layer 330, and a fourth insulating layer 340 are disposed on the semiconductor substrate 100 in this order from the semiconductor substrate 100 side. The first insulating layer 310, the second insulating layer 320, the third insulating layer 330, and the fourth insulating layer 340 form an interlayer insulating film that is a multiple-layer film for supporting and insulating the respective metal layers. The interlayer insulating film is transparent to incident light to be converted by the photoelectric conversion device 1, and each insulating layer disposed on top of the photoelectric conversion element 130 is located in an optical path of light incident on the light receiving units 11.

An intermediate film 400 is disposed on top of the fourth insulating layer 340. The intermediate film 400 may be a single-layer film or a multiple-layer film. The intermediate film 400 includes a layer having at least one of a chemical function, a mechanical function, an optical function, and an electrical function, such as a passivation layer, a planarization layer, an anti-reflection layer, or an insulating layer.

A color filter 500 is disposed on top of the intermediate film 400. The color filter 500 has spectral characteristics in a specific wavelength region of visible light. The light receiving section 10 includes a color filter array in which a plurality of kinds of color filters having different spectral characteristics are arranged in a two-dimensional array in accordance with the arrangement of the light receiving units 11. Each color filter may be a primary (RGB) or complementary (CYM) color filter, or may be a combination thereof.

The micro lens 600 is disposed on top of the color filter 500 at a position corresponding to the photoelectric conversion element 130. The light receiving section 10 includes a micro-lens array in which a plurality of micro lenses 600 are arranged in a two-dimensional array in accordance with the arrangement of the light receiving units 11. In the micro-lens array of the light receiving section 10, adjacent micro lenses 600 may be arranged in contact with or spaced apart from each other.

Accordingly, each of the light receiving units 11 in the illustrated example includes, in addition to the photoelectric conversion element 130 and the micro lens 600, the respective insulating layers, the intermediate film 400, and the color filter 500. At least one metal layer in the metal structure can have a function of defining or limiting the optical path of light incident on the light receiving unit 11 up to the photoelectric conversion element 130.

Next, an overview of methods for forming each semiconductor region and each member when manufacturing the photoelectric conversion device 1 will be described. The photoelectric conversion device 1 can be manufactured by forming a semiconductor region or each constituent member in or on a semiconductor wafer (hereinafter referred to as a "wafer") by using a patterning technique that uses a patterning tool. Typical examples of the patterning technique include a photolithography technique in which a photomask (also called a reticle) is used as a patterning tool. However, as described below, the patterning tool is not limited to a photomask, and the patterning technique is not limited to the photolithography technique.

The photolithography technique using a photomask includes, as at least a portion thereof, a method of transferring a pattern of a photomask (patterning tool) to a photoresist by exposing the photoresist to light through the photomask and by developing the photoresist exposed to light. The photolithography technique includes a patterning technique using a photoresist to which a pattern has been transferred. The patterning technique includes changing a base member of the constituent member to be formed, in a predetermined manner using a patterned photoresist as a mask. The phrase "changing in a predetermined manner" includes introducing an impurity into the base member by ion implantation or the like, and making chemical changes, such as thermal oxidation and curing, to the base member. The phrase "changing in a predetermined manner" also includes removing part of the base member using etching such as dry etching or wet etching or lift-off. The base member of the constituent member can be formed using general film deposition techniques such as evaporation, sputtering, chemical vapor deposition (CVD), and coating. The base member may or may not be changed in a predetermined manner in the presence of a photoresist patterned using a photomask. For example, first, a mask for changing the base member in a predetermined manner may be patterned using a patterned photoresist. After the patterned photoresist has been removed, the base member may be changed in a predetermined manner using the patterned mask. In this case, the patterned mask is generally made of an inorganic material rather than an organic material (resin) such as a photoresist, and is called a hard mask.

In this way, a constituent member of a photoelectric conversion device that has been formed using a patterning tool has a shape and property distribution that reflects the pattern of the patterning tool, such as a photomask, in accordance with the changes in a predetermined manner.

Forming a member on a wafer by patterning involves alignment (or position registration) of a patterning tool used in the various patterning techniques described above with the member previously formed on the wafer. Alignment is also involved in preparing a patterned constituent member in advance and placing the constituent member on a wafer without patterning on the wafer. Alignment may be performed by the same patterning tool as the member previously formed on the wafer, using as a reference an alignment mark formed in the same process as the previously formed member, that is, an alignment mark formed using the same patterning tool. An example of alignment using a photomask as a patterning tool will be given below.

Examples of the alignment mark may include a set of alignment marks including an X-coordinate measurement alignment mark provided on a wafer and a Y-coordinate measurement alignment mark that is arranged at an angle of 90 degrees with respect to the X-coordinate measurement alignment mark. Each alignment mark is read by an optical detector included in an exposure device such as a stepper to obtain the X and Y coordinates of the positions of the alignment marks. The positions of the stage and the wafer are determined on the basis of the coordinates, and a photomask is placed at an appropriate position corresponding to the position of the wafer. Therefore, alignment between the wafer and the photomask can be achieved.

An adjustment alignment mark provided on the wafer may also be used as an alignment mark to achieve more accurate alignment. For example, an adjustment alignment pattern is provided on a photomask. After alignment is performed using the measurement alignment marks described above, a positional displacement between the adjustment alignment marks and the adjustment alignment pattern is optically detected. The positions of the photomask and the wafer are adjusted so as to correct the displacement. Alignment may be performed using only the measurement alignment marks or may be performed using only the adjustment alignment mark. In addition, the measurement alignment marks may also be used as adjustment alignment marks.

In addition, in a given process, alignment marks may be formed at a plurality of positions in the mark section 30. Each time alignment is performed in a process subsequent to the given process, an alignment mark appropriately selected from among the alignment marks formed at the plurality of positions can be used as a reference of alignment in the subsequent process.

When alignment is performed, exposure is carried out. In order to manufacture the photoelectric conversion device 1, there is a need to perform patterning at substantially the same position on a wafer in a plurality of processes to form a plurality of constituent members. If an alignment error occurs, however, the repetition of patterning in the plurality of processes causes errors to be accumulated. As a result, the position of a member formed finally in the manufacturing process may be displaced with respect to the position of a member formed initially in the manufacturing process by an error range equal to or more than an allowable error from the design value.

Figure 10A:
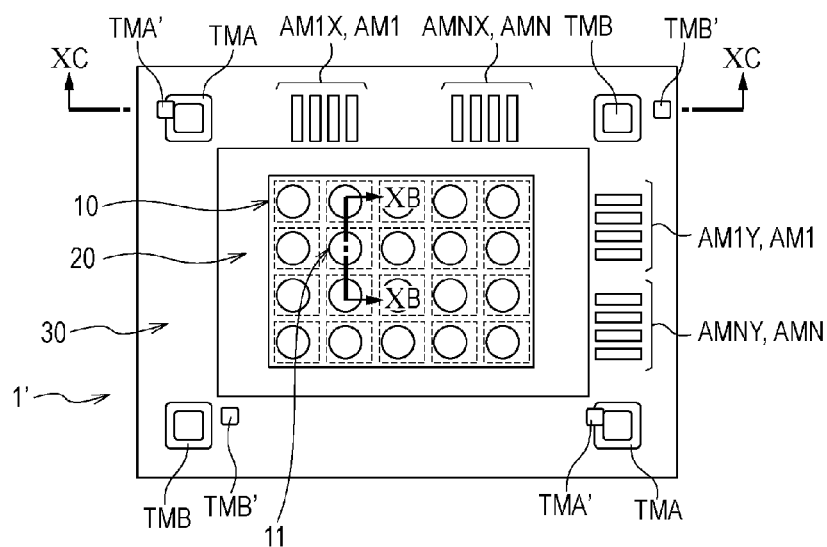
FIGS. 10A to 10C are schematic diagrams illustrating the present invention.
Figure 10B:
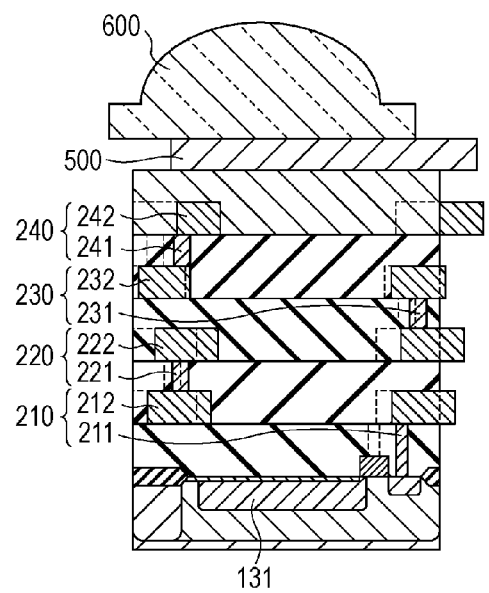
Figure 10C:
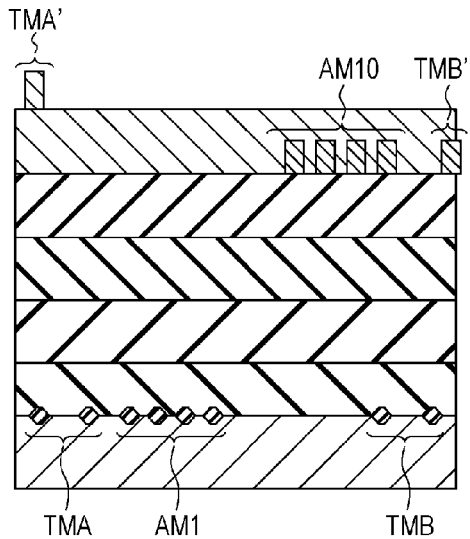

FIG. 10A is a plan view of a photoelectric conversion device 1' for comparison with the photoelectric conversion device 1 illustrated in FIG. 1A. FIG. 10B is a cross-sectional view of one of light receiving units 11, taken along line XB-XB in FIG. 10A, and FIG. 10C is a cross-sectional view of a mark section 30, taken along line XC-XC in FIG. 10A.

As illustrated in FIG. 10B, if the relative positions of a photoelectric conversion element 130 and a micro lens 600 in the light receiving unit 11 are significantly deviated from the design values, the optical performance as designed may not be achieved.

In order to avoid this inconvenience, alignment in the process of forming a photoelectric conversion element and alignment in the process of forming a micro lens are performed using as a reference an alignment mark formed in the process of forming an isolation region, which is performed prior to the above processes. Therefore, the photoelectric conversion device 1 having high optical performance as designed can be achieved.

A method for manufacturing a photoelectric conversion device according to the present invention will be described in detail hereinafter. Typically, the photoelectric conversion device 1 is manufactured as follows. A plurality of photoelectric conversion devices 1 are created at a plurality of locations on a semiconductor wafer. Preferably, alignment is performed for each of the plurality of locations. In addition, variation in characteristics of the plurality of photoelectric conversion devices 1 created on the wafer can be reduced by disposing mark sections 30 in a plurality of locations and arranging the mark sections 30 near the individual light receiving sections 10. However, alignment may be performed using an alignment mark during the exposure of only a specific location to light and, during the exposure of the other locations to light, alignment may be performed only by the movement of the stage based on the positional relationships between the specific location and the other locations. After a plurality of steps of patterning have been completed for all the locations, the wafer that has undergone the patterning is diced along scribe lines. Therefore, a single wafer is divided to obtain a plurality of chips, each of which is the photoelectric conversion device 1. However, the present invention is not limited to obtaining a plurality of chips from a single wafer, and, for example, a photoelectric conversion device 1 having a wafer size may be obtained from a single wafer. The following description will be given of one of a plurality of parts on a wafer, which form the photoelectric conversion device 1.

First Embodiment

An example of a method for manufacturing the photoelectric conversion device 1 according to a first embodiment will be described in the typical order of processes with cross-reference to FIGS. 3, 4, 5, and 6. In the photoelectric conversion device 1, a silicon substrate is used as the semiconductor substrate 100. In FIGS. 3, 4, 5, and 6, substantially the same configuration elements as those in FIGS. 1A, 1B, 2A, and 2B are represented by the same reference numerals, and descriptions thereof are thus omitted.

Figure 3:
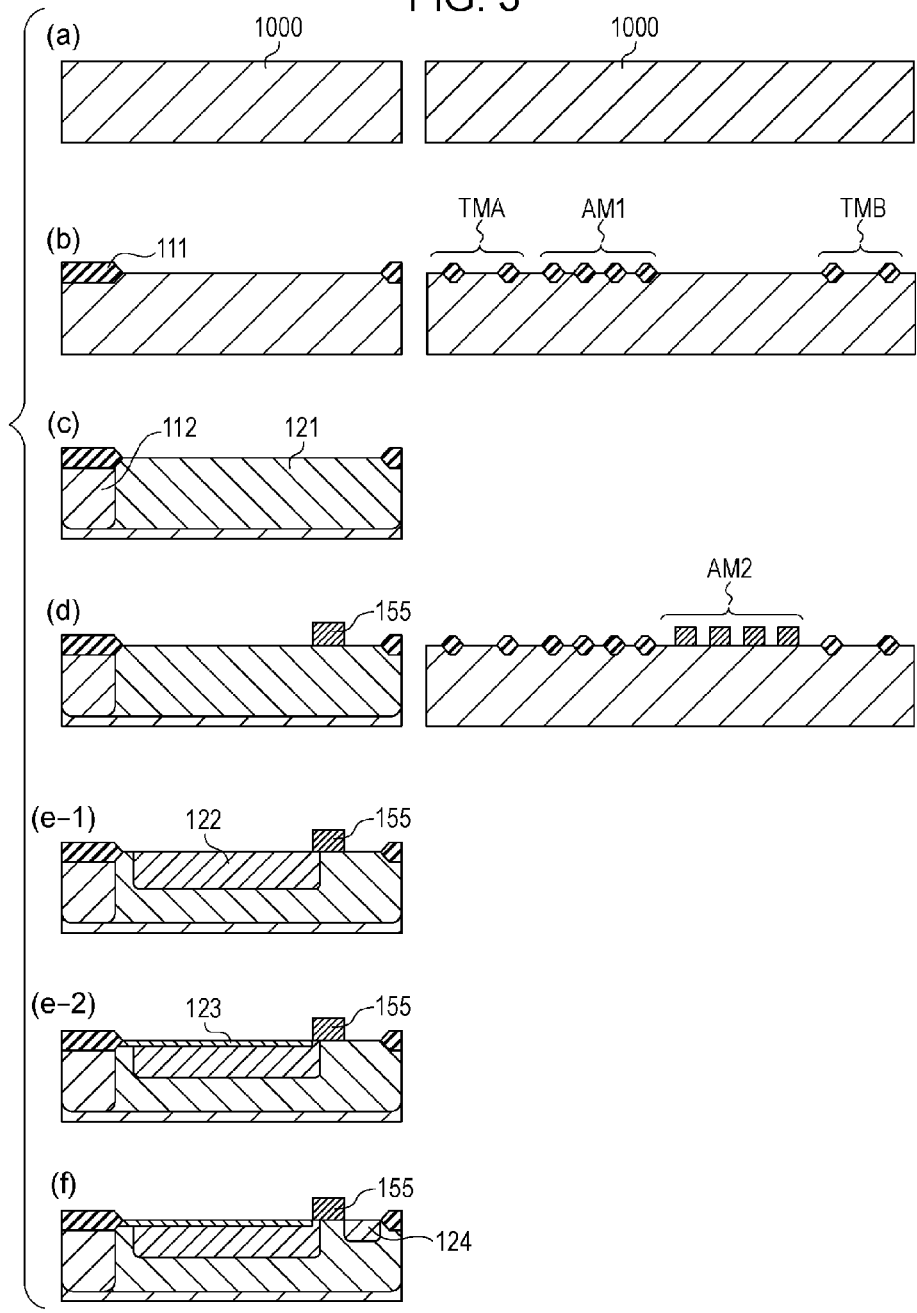
FIG. 3 is a schematic diagram illustrating an example of a method for manufacturing the photoelectric conversion device according to the present invention.
Figure 4:
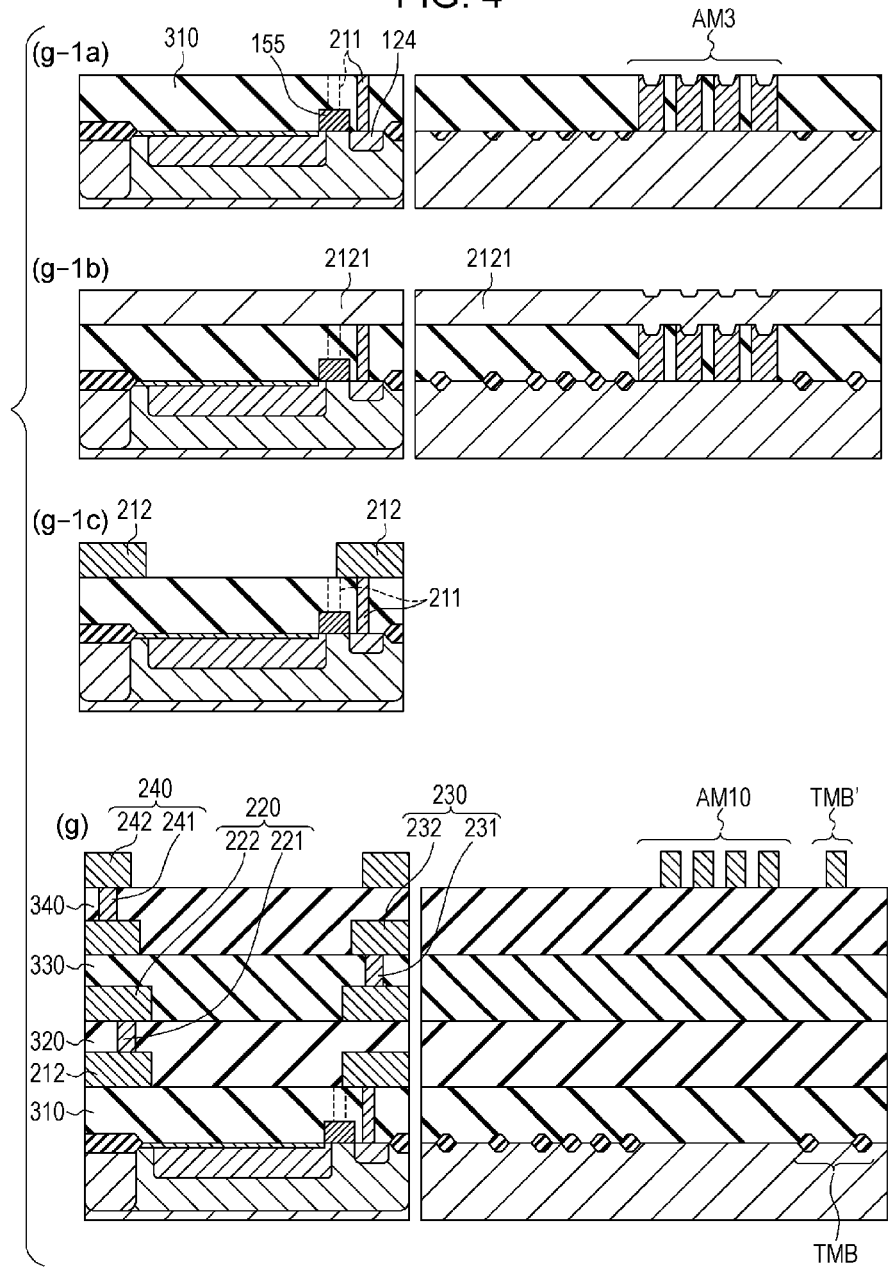
FIG. 4 is a schematic diagram illustrating an example of the method for manufacturing the photoelectric conversion device according to the present invention.
Figure 5:
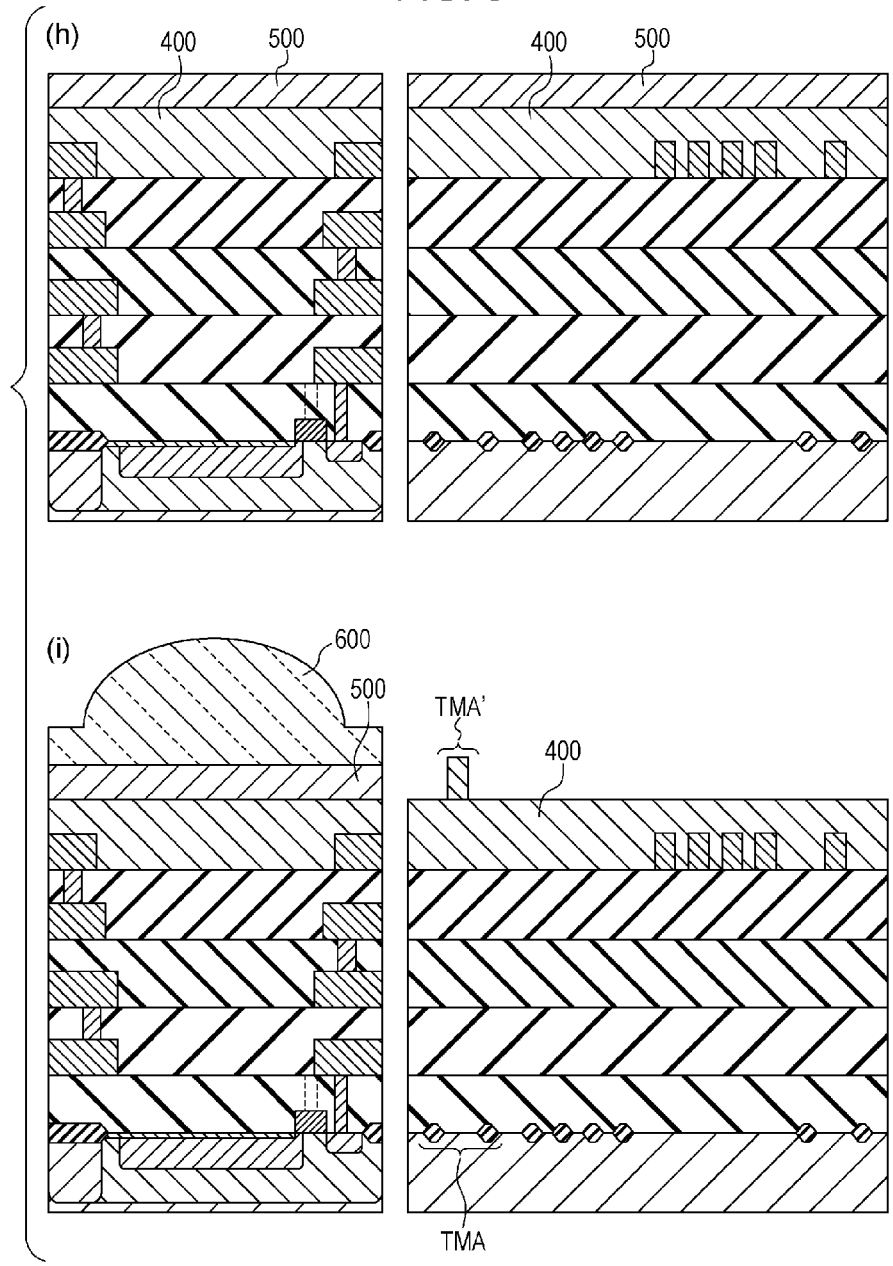
FIG. 5 is a schematic diagram illustrating an example of the method for manufacturing the photoelectric conversion device according to the present invention.
Figure 6:
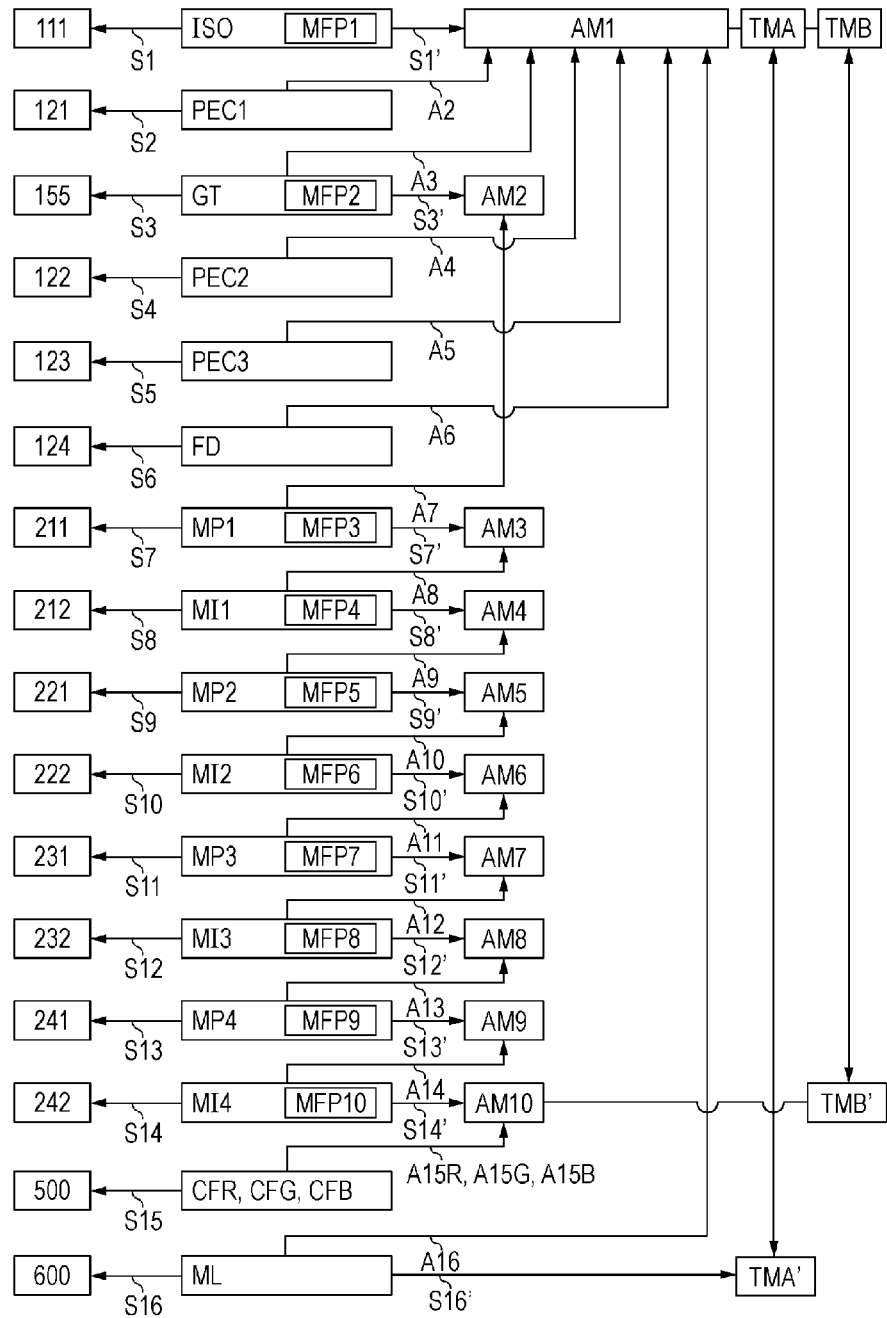
FIG. 6 is a schematic diagram illustrating an example of the method for manufacturing the photoelectric conversion device according to the present invention.

FIGS. 3, 4, and 5 illustrate cross-sectional views of the photoelectric conversion device 1 in the respective processes. In each drawing, the left side illustrates a cross-sectional view of one of the light receiving units 11 of the light receiving section 10, taken along line A-B in FIGS. 1A and 2A, and the right side illustrates a cross-sectional view of the mark section 30, taken along line C-D in FIG. 1A. FIG. 6 illustrates relationships between manufacturing processes and photomasks used in the manufacturing processes. In FIG. 6, right- and left-oriented arrows indicate members or regions to be formed in the same processes using the respective photomasks, and upward-oriented arrows indicate objects to be used as references of alignment.

Process (a)

This process will be described with reference to part (a) of FIG. 3. A first-conductivity-type semiconductor wafer 1000 (hereinafter referred to as the "wafer 1000") is prepared. The wafer 1000 may be a single-crystal silicon layer epitaxially grown on a silicon base. A Silicon On Insulator (SOI) wafer may be used as the wafer 1000.

Process (b)

This process will be described with reference to part (b) of FIG. 3 and FIG. 6. A silicon nitride film (not illustrated) is formed on top of the wafer 1000, and a photoresist film is coated on top of the silicon nitride film. The photoresist film is patterned using a photomask ISO. The alignment of the photomask ISO may be performed using, for example, the initial position of the stage, the orientation flat of the wafer, or the like as a reference. The silicon nitride film is etched using as a mask the photoresist film patterned using the photomask ISO. A surface of the wafer 1000 is oxidized by dry oxidation or wet oxidation using the patterned silicon nitride film as a mask. Thus, an isolation insulator 111 is formed in the isolation region 110 by the LOCOS method (S1). The majority of a region covered by the silicon nitride film, where the isolation insulator 111 is not formed, forms an active region 120. The photoresist film patterned using the photomask ISO is removed.

Here, the photomask ISO has a mark forming pattern MFP1. In this process, an alignment mark AM1 having a pattern that reflects the mark forming pattern MFP1 is formed at the same time as the formation of the isolation insulator 111 (S1'). That is, the alignment mark AM1 is formed of silicon oxide, which is the same as the material of the isolation insulator 111, and is formed by, similarly to the isolation insulator 111, thermally oxidizing the surface of the wafer 1000 using the silicon nitride film as a mask. In a schematic illustration in FIG. 1A, as described above, the alignment mark AM1 is a set of an X-coordinate measurement alignment mark AM1X and a Y-coordinate measurement alignment mark AM1Y. In the illustrated example, each of the X-coordinate measurement alignment mark AM1X and the Y-coordinate measurement alignment mark AM1Y has a shape in which four substantially rectangular isolation insulators 111 are arranged at equal pitches. However, the above shape is merely an example, and can be changed in accordance with the exposure device or the like to be used. In the example illustrated in FIG. 1A, furthermore, the X-coordinate measurement alignment mark AM1X and the Y-coordinate measurement alignment mark AM1Y are arranged at different sides of the mark section 30. However, the X-coordinate measurement alignment mark AM1X and the Y-coordinate measurement alignment mark AM1Y may be arranged adjacent to each other. In FIG. 1A, an alignment mark AMN adjacent to the alignment mark AM1 is a schematic representation of an alignment mark other than the alignment mark AM1, such as an alignment mark AM2 or AM10 described below. The alignment mark AMN also has a set of an X-coordinate measurement alignment mark AMNX and a Y-coordinate measurement alignment mark AMNY. In actuality, individual alignment marks are located at a plurality of positions in the mark section 30 in such a manner that the alignment marks are shifted with respect to one another so as not to overlap one another. However, for convenience of illustration, alignment marks other than the alignment mark AM1 are collectively illustrated as the alignment mark AMN.

While the description has been given herein of an example in which the isolation region 110 is defined using the LOCOS method, the isolation region 110 may also be defined using STI. Since STI includes a trench forming step and a buried insulating film forming step, typically, the alignment mark AM1 is also formed by the trench forming step and the buried insulating film forming step. However, a trench formed in the trench forming step may be used as the alignment mark AM1 without any buried insulating film being formed in the mark section 30.

An element isolation method based on diffusion isolation may also be used as an element isolation method for forming the isolation insulator 111 using the photomask ISO. The formation of an isolation region in the peripheral circuit section 20 may be performed using a process different from this process. For example, the isolation region 110 in the light receiving section 10 may be formed by the LOCOS method, and an isolation region in the peripheral circuit section 20 may be formed using STI. In this case, the alignment mark AM1 is formed by the LOCOS method at the same time as the formation of the isolation insulator 111 in the isolation region 110 in the light receiving section 10 using the LOCOS method.

Process (c)

This process will be described with reference to part (c) of FIG. 3 and FIG. 6. A photoresist film is coated on top of the wafer 1000. The photoresist film is patterned using a photomask so as to have an opening in a portion corresponding to the light receiving section 10, and acceptor ions are implanted into substantially the entirety of the light receiving section 10 (the isolation region 110 and the active region 120) to form a second-conductivity-type impurity region. Part of the second-conductivity-type impurity region forms an impurity region 121. In this case, photomask alignment may be performed using the alignment mark AM1 as a reference or using, for example, the orientation flat of the wafer or the like as a reference, or may be performed only by moving the stage. After the photoresist film has been removed, a photoresist film is formed again. The photoresist film is patterned using a photomask PEC1. In this case, the alignment of the photomask PEC1 is performed using the alignment mark AM1 on the wafer 1000 as a reference (A2). Acceptor ions are implanted into the isolation region 110 on the wafer 1000 through the isolation insulator 111 using as a mask the photoresist film patterned using the photomask PEC1. Thus, a second-conductivity-type seventh semiconductor region 112 having an impurity concentration higher than the second-conductivity-type impurity region in the active region 120 is formed in the isolation region 110. As a result, a second-conductivity-type impurity region 121 (well region) to be used as the second semiconductor region 132, the fifth semiconductor region 145, and the sixth semiconductor region 156 is defined (S2). The second-conductivity-type impurity region 121 may be formed by performing ion implantation a plurality of times with different implantation energies and implantation doses. The seventh semiconductor region 112 may also be formed by performing ion implantation a plurality of times. The photoresist film patterned using the photomask PEC1 is removed.

Process (d)

This process will be described with reference to part (d) of FIG. 3 and FIG. 6. A surface of the active region 120 on the wafer 1000 is oxidized by dry oxidation or wet oxidation. Thus, a gate oxide film for the gates of a transfer transistor and other transistors is formed. Next, a polysilicon film is deposited on top of the gate oxide film, and a photoresist film is coated on top of the polysilicon film. The photoresist film is patterned using a photomask GT. In this case, the alignment of the photomask GT is performed using the alignment mark AM1 on the wafer 1000 as a reference (A3). The polysilicon film is etched using as a mask the photoresist film patterned using the photomask GT. Thus, a transfer gate electrode 155 is formed (S3). The photoresist film patterned using the photomask GT is removed.

Here, the photomask GT has a mark forming pattern MFP2. In this process, an alignment mark AM2 having a pattern that reflects the alignment mark MFP2 is formed at the same time as the formation of the transfer gate electrode 155 (S3'). That is, the alignment mark AM2 is made of polysilicon, which is the same as the material of the transfer gate electrode 155, and is formed by, similarly to the transfer gate electrode 155, etching the polysilicon film using a photoresist film as a mask. Control electrodes of transistors disposed on the wafer 1000, for example, the gate electrodes of the respective transistors of each pixel circuit and the gate electrode of each transistor in the peripheral circuit section 20, are also formed in this process.

Process (e-1)

This process will be described with reference to part (e-1) of FIG. 3 and FIG. 6. A photoresist film is coated on top of the wafer 1000. The photoresist film is patterned using a photomask PEC2. In this case, the alignment of the photomask PEC2 is performed using the alignment mark AM1 on the wafer 1000 as a reference (A4). Donor ions are implanted into the impurity region 121 of the active region 120 on the wafer 1000 using as masks the transfer gate electrode 155 and the photoresist film patterned using the photomask PEC2. Thus, a first-conductivity-type impurity region 122 to be used as the first semiconductor region 131 is formed in the active region 120 (S4). In this case, the ion implantation is implemented using oblique ion implantation, thereby allowing, as illustrated in part (e-1) of FIG. 3, an end of the impurity region 122 to encroach beneath the transfer gate electrode 155. The photoresist film patterned using the photomask PEC2 is removed.

Process (e-2)

This process will be described with reference to part (e-2) of FIG. 3 and FIG. 6. A photoresist film is coated on top of the wafer 1000. The photoresist film is patterned using a photomask PEC3. In this case, the alignment of the photomask PEC3 is performed using the alignment mark AM1 on the wafer 1000 as a reference (A5). Acceptor ions are implanted into the impurity region 121 on the wafer 1000 using as masks the transfer gate electrode 155 and the photoresist film patterned using the photomask PEC3. Thus, a second-conductivity-type impurity region 123 to be used as the third semiconductor region 133 is formed in the active region 120 (S5). The photoresist film patterned using the photomask PEC3 is removed.

Process (f)

This process will be described with reference to part (f) of FIG. 3 and FIG. 6. A photoresist film is coated on top of the wafer 1000. The photoresist film is patterned using a photomask FD. In this case, the alignment of the photomask FD is performed using the alignment mark AM1 on the wafer 1000 as a reference (A6). Donor ions are implanted into the impurity region 121 on the wafer 1000 using as masks the transfer gate electrode 155 and the photoresist film patterned using as the photomask FD. Thus, a first-conductivity-type impurity region 124 to be used as the fourth semiconductor region 144 is formed (S6). The photoresist film patterned using the photomask FD is removed.

Accordingly, the photoelectric conversion element 130, at least a portion of the capacitor part 140, and the transfer transistor 150 are formed. As described with reference to the process (e-1), it may be sufficient to perform at least the alignment (A4) for forming the first-conductivity-type semiconductor region 131 of the photoelectric conversion element 130 using the alignment mark AM1 as a reference. In the illustrated example, the photoelectric conversion element 130 is formed prior to and after the process (d). However, the impurity regions 122 and 123 to be used as the first semiconductor region 131 and the third semiconductor region 133, respectively, may be formed prior to the process (d). However, by forming the impurity regions 122 and 123 after the process (d), it is possible to form the first semiconductor region 131 and the third semiconductor region 133 in a self-aligned manner using the transfer gate electrode 155 as a mask. The impurity region 124 to be used as the fourth semiconductor region 144 can also be formed in a self-aligned manner using the transfer gate electrode 155 as a mask.

In addition, prior to the subsequent process (g), a second-conductivity-type semiconductor region to be used as a channel stop region may be formed in the isolation region 110 using an appropriate mask, if necessary. The formation of a channel stop region is typically performed prior to the process (d). The main electrodes (source, drain) of transistors disposed in the light receiving section 10 on the wafer 1000, for example, individual transistors of each pixel circuit, may also be formed by performing photomask alignment using the alignment mark AM1 as a reference. Since the main electrodes of each transistor can be formed in a self-aligned manner using the control electrode of the transistor as a mask, the alignment of a photomask for forming the main electrodes may be performed using the alignment mark AM1 rather than the alignment mark AM2 as a reference. Thus, the main electrodes of each transistor can be formed at positions appropriate to both the isolation region 110 and the gate electrode. Typically, the alignments of a plurality of photomasks for patterning photoresist films to be formed to perform the ion implantation process on the light receiving section 10 a plurality of times are all performed using the alignment mark AM1 as a reference. However, all the alignments of photomasks other than a photomask for forming the photoelectric conversion element 130 are not necessarily be performed using the alignment mark AM1 as a reference, and the alignment mark AM2 may be used as a reference, if necessary.

Process (g-1)

This process will be described with reference to parts (g-1a) to (g-1c) and (g) of FIG. 4 and FIG. 6. A first insulating layer 310 is formed on top of the wafer 1000. After the first insulating layer 310 has been formed, the first insulating layer 310 can be planarized, if necessary, using a method such as reflow, chemical mechanical polishing (CMP), or etch-back. Alternatively, the first insulating layer 310 may be formed using Spin On Glass (SOG). The first insulating layer 310 is preferably made of a material containing silicon oxide as a main component, such as silicon oxide, borophosphosilicate glass (BPSG), borosilicate glass (BSG), or phosphosilicate glass (PSG), and is more preferably made of BPSG.

Then, a photoresist film is coated on top of the first insulating layer 310. The photoresist film is patterned using a photomask MP1. In this case, the alignment of the photomask MP1 is performed using the alignment mark AM2 on the wafer 1000 as a reference (A7). The first insulating layer 310 is etched using as a mask the photoresist film patterned using the photomask MP1. Thus, a first through-hole (contact hole) is formed in the first insulating layer 310 so as to reach the transfer gate electrode 155, the fourth semiconductor region 144, and the gate electrodes and/or main electrodes of other transistors. The photoresist film patterned using the photomask MP1 is removed.

Here, the photomask MP1 has a mark forming pattern MFP3. In this process, a through-hole having a pattern that reflects the mark forming pattern MFP3 is formed at the same time as the formation of the first through-hole. The size of the through-hole having the pattern that reflects the mark forming pattern MFP3 may be set larger than the size of the first through-hole.

A metal film is formed on top of the first insulating layer 310 so as to fill the first through-hole. Then, the metal film is removed using CMP or a similar method until the first insulating layer 310 is exposed. Through the above plug forming step, a first metal plug 211 to be connected to the transfer gate electrode 155, the fourth semiconductor region 144, and the gate electrodes and/or main electrodes of other transistors is formed (S7). The first metal plug 211 may be made of tungsten. At the same time as the formation of the first metal plug 211, the same metal material as the material of the first metal plug 211 is also filled in the through-hole having the pattern that reflects the mark forming pattern MFP3. Since the through-hole having the pattern that reflects the mark forming pattern MFP3 has a larger size than the first through-hole, the filled metal material is formed in such a manner that the upper surface of the filled metal material is recessed with respect to the upper surface of the first insulating layer 310 (part (g-1a) of FIG. 4, S7'). The recess in the upper surface of the metal material filled in the through-hole having the pattern that reflects the mark forming pattern MFP3 forms an alignment mark AM3 that is formed by the mark forming pattern MFP3.

A metal film 2121 is formed on top of the first insulating layer 310. The metal film 2121 formed on top of the first insulating layer 310 has irregularities in accordance with the alignment mark AM3 (part (g-1b) of FIG. 4). Then, a photoresist film is coated on top of the metal film 2121. The photoresist film is patterned using a photomask MI1. In this case, the alignment of the photomask MI1 is performed using the alignment mark AM3 on the wafer 1000 as a reference (A8). As described above, the metal film 2121 has irregularities in accordance with the alignment mark AM3. Thus, the alignment mark AM3 is easily detected on the basis of the irregularities. The metal film is etched using as a mask the photoresist film patterned using the photomask MI1. Through the above interconnection forming step, a first metal interconnection 212 is formed (S8).

The photomask MI1 has a mark forming pattern MFP4. In this process, an alignment mark AM4 having a pattern that reflects the mark forming pattern MFP4 is formed at the same time as the formation of the first metal interconnection 212 (S8'). That is, the alignment mark AM4 is formed of a metal, which is the same as the material of the first metal interconnection 212, and is formed by, similarly to the first metal interconnection 212, etching the metal film using the photoresist film as a mask. In this way, a first metal layer 210 is formed (part (g-1c) of FIG. 4).

As described above, the reason that an alignment mark that takes advantage of a recess is used is that when the metal film 2121 is formed over an entire surface of the wafer 1000, an underlying layer of the metal film 2121 is shielded from light by the metal film 2121, and it is difficult to optically read a mark in the underlying layer. However, after the metal film 2121 is formed, a portion of the metal film 2121 positioned above an alignment mark in the underlying layer is selectively removed, thus enabling the alignment mark to be optically read after the metal film 2121 has been formed, even if irregularities are not formed in the metal film 2121.

In FIG. 6, by way of example, alignment for forming a metal interconnection in each metal layer is performed using as a reference an alignment mark formed at the same time as the formation of a metal plug in the same metal layer. However, alignment for forming a metal interconnection in each metal layer may be performed using as a reference an alignment mark to be used as a reference of alignment for forming a metal plug in the same metal layer. That is, alignments in the metal plug forming step and the metal interconnection forming step for the same metal layer may be performed using the same alignment mark as a reference.

Process (g-2)

This process will be described with reference to part (g) of FIG. 4 and FIG. 6. After a second insulating layer 320 is formed, a second metal layer 220 is formed by sequentially forming a second metal plug 221 and a second metal interconnection 222. This process can be performed using a plug forming step and an interconnection forming step in a manner similar to that in the process (g-1), and a brief description thereof will be given.

A second through-hole (via hole) is formed in the second insulating layer 320 using a photomask MP2. In this case, the alignment of the photomask MP2 is performed using the alignment mark AM4 on the wafer 1000 as a reference (A9). Then, a second metal plug 221 is formed (S9). The photomask MP2 has a mark forming pattern MFP5. The second metal interconnection 222 is formed using a photomask MI2 (S10). The alignment of the photomask MI2 is performed using the alignment mark AM5 on the wafer 1000, which reflects the mark forming pattern MFP5, as a reference (A11). In this way, a second metal layer 220 is formed by the process (g-2). The photomask MI2 has a mark forming pattern MFP6, and an alignment mark AM6 is formed (S10').

Process (g-3)

This process will be described with reference to part (g) of FIG. 4 and FIG. 6. After a third insulating layer 330 is formed, a third metal layer 230 is formed by sequentially forming a third metal plug 231 and a third metal interconnection 232. This process can also be performed using a plug forming step and an interconnection forming step in a manner similar to that in the process (g-1), and a brief description thereof will be given below.

A third through-hole (via hole) is formed in the third insulating layer 330 using a photomask MP3. In this case, the alignment of the photomask MP3 is performed using the alignment mark AM6 on the wafer 1000 as a reference (A11). Then, a third metal plug 231 is formed (S11). The photomask MP3 has a mark forming pattern MFP7. The third metal interconnection 232 is formed using a photomask MI3 (S12). The alignment of the photomask MI3 is performed using the alignment mark AM7 on the wafer 1000, which reflects the mark forming pattern MFP7, as a reference (A12). Therefore, the third metal layer 230 is formed by the process (g-3). The photomask MI3 has a mark forming pattern MFP8, and an alignment mark AM8 is formed (S12').

Process (g-4)

This process will be described with reference to part (g) of FIG. 4 and FIG. 6. After a fourth insulating layer 340 is formed, a fourth metal layer 240 is formed by sequentially forming a fourth metal plug 241 and a fourth metal interconnection 242. This process can also be performed using a plug forming step and an interconnection forming step in a manner similar to the process (g-1), and a brief description thereof will be given below.

A fourth through-hole (via hole) is formed in the fourth insulating layer 340 using a photomask MP4. In this case, the alignment of the photomask MP4 is performed using the alignment mark AM8 on the wafer 1000 as a reference (A13). Then, a fourth metal plug 241 is formed (S13). The photomask MP4 has a mark forming pattern MFP9. The fourth metal interconnection 242 is formed using a photomask MI4 (S14). The alignment of the photomask MI4 is performed using the alignment mark AM9 on the wafer 1000, which reflects the mark forming pattern MFP9, as a reference (A14). Therefore, the fourth metal layer 240 is formed by the process (g-4). The photomask MI4 has a mark forming pattern MFP10, and an alignment mark AM10 is formed (S14').

In this way, a metal structure including the first metal layer 210, the second metal layer 220, the third metal layer 230, and the fourth metal layer 240 can be formed (part (g) of FIG. 4).

Process (h)

This process will be described with reference to part (h) of FIG. 5 and FIG. 6. An intermediate film 400 is formed on top of the wafer 1000 (on top of the fourth insulating layer 340 and the fourth metal interconnection 242). The intermediate film 400 may not necessarily be subjected to patterning. Then, a color filter array is formed on top of the intermediate film 400 (S15). For example, a Bayer pattern color filter array may be formed in the following way. After a green photoresist is coated on an entre surface of the intermediate film 400, the green photoresist is patterned in a checkered pattern using a photomask CFG to form a green color filter. In this case, the alignment of the photomask CFG is performed using the alignment mark AM10 on the wafer 1000 as a reference (A15G). After a red photoresist is coated on an entire surface of the intermediate film 400, the red photoresist is patterned in a checkered pattern using a photomask CFR to form a red color filter. In this case, the alignment of the photomask CFR is performed using the alignment mark AM10 on the wafer 1000 as a reference (A15R). After a blue photoresist is coated on an entire surface of the intermediate film 400, the blue photoresist is patterned in a checkered pattern using a photomask CFB to form a blue color filter. In this case, the alignment of the photomask CFB is performed using the alignment mark AM10 on the wafer 1000 as a reference (A15B). In the foregoing description, by way of example, alignments for forming color filters of the respective colors are performed using the alignment mark AM10 as a reference. However, alignment for forming a color filter of a certain color (for example, a blue color filter) may be performed using as a reference an alignment mark formed at the same time as the formation of the previous color filter (for example, a green color filter). Preferably, substantially the entirety of the peripheral circuit section 20 is covered by a blue color filter in order to suppress incidence of unnecessary light onto peripheral circuits to reduce noise in the peripheral circuits. The entirety of the mark section 30 may also be covered by a color filter (typically, a blue color filter); however, preferably, no color filters are formed on top of at least the alignment mark AM1.

Process (i)

This process will be described with reference to part (i) of FIG. 5 and FIG. 6. In this process, a micro lens 600 is formed (S16). Here, by way of example, the micro lens 600 is formed using a gradation exposure method. A photosensitive resin film is coated on top of the wafer 1000 (on top of the color filter array). Examples of the material of the photosensitive resin film may include an acrylic resin and a styrene-based resin.

The photosensitive resin film is exposed to light using a photomask ML serving as a gradation mask. In this case, the alignment of the photomask ML is performed using the alignment mark AM1 on the wafer 1000 as a reference (A16). If a color filter is located on top of the alignment mark AM1, the alignment mark AM1, which is an insulator, will be detected through the color filter. Thus, an alignment error may occur. As described above, no color filters are disposed on top of the alignment mark AM1 in the process (h), thus allowing the alignment mark AM1 to be detected without using any color filters, leading to improved alignment accuracy. In the illustrated example, the photomask ML has a gradation pattern having a light transmittance distribution corresponding to the surface shape of a micro lens. For example, if the photosensitive resin film is of the positive type, a portion exposed to a large amount of light is removed during development, resulting in a thin photosensitive resin film being formed. Since the micro lens is a convex lens, the photomask ML exhibits a low light transmittance at a center portion of one micro lens pattern, and a high light transmittance at a peripheral portion of the micro lens pattern.

Here, by way of example, a micro lens is formed using a gradation exposure method. However, the present invention is not limited to this example, and a reflow method or various methods such as etch-back combined with a reflow method or a gradation exposure method may be used. If a reflow method is used, a reflowed resin may be patterned using the photomask ML.

Alternatively, the micro lens 600 may be formed on top of the photoelectric conversion element 130, without performing patterning on the wafer 1000, but by preparing a sheet having a micro-lens array formed thereon in advance and bonding the sheet to the wafer 1000. Also in this case, the alignment of the sheet is performed using the alignment mark AM1 as a reference.

As described above with reference to FIG. 1A, the photoelectric conversion device 1 in the illustrated example has the mark section 30 in which alignment marks and the like are disposed. The reason is that, before the wafer is diced, the mark sections 30 are disposed on the chip side of scribe lines on the wafer. For this reason, after the wafer has been diced, each photoelectric conversion device 1 (chip) has the mark section 30 in which alignment marks and the like are disposed. However, in a case where the mark sections 30 are disposed along scribe lines or the like on the wafer before the wafer is diced, each photoelectric conversion device 1 does not have the mark section 30 after the wafer has been diced into chips. By arranging the mark sections 30 along scribe lines, it is possible to reduce the area of the photoelectric conversion devices 1 (chips) by an amount corresponding to the mark sections 30, which have substantially no function in the photoelectric conversion devices 1. The present invention may encompass a photoelectric conversion device 1 having a mark section 30 and a photoelectric conversion device 1 having no mark sections because mark sections have been removed during dicing.

The photoelectric conversion device 1 can be manufactured by the foregoing processes. According to this embodiment, in the process (e-1c) (and the process (e-2)), the alignment of the photomask PEC2 (and PEC3) is performed using as a reference the alignment mark AM1 formed using the photomask ISO in the process (b). Also in the process (i), the alignment of the photomask ML is performed using as a reference the alignment mark AM1 formed using the photomask ISO in the process (b). In this way, the photomask PEC2 to be used to form the photoelectric conversion element 130 and the photomask ML to be used to form the micro lens 600 are aligned using the same alignment mark AM1 as a reference. Therefore, the deviation of the relative positional relationship between the photoelectric conversion element 130 and the micro lens from the design value can be reduced, and a photoelectric conversion device 1 having a value close to the design value and having desired performance can be obtained. It is also preferable that the relative position of the center of the photoelectric conversion element 130 with respect to the optical axis of the micro lens 600 be made different from one light receiving unit 11 to another in accordance with the position of the light receiving unit 11 in the light receiving section 10. The present invention achieves especially significant competitive advantages when the above design is employed.

Second Embodiment

Figure 7:
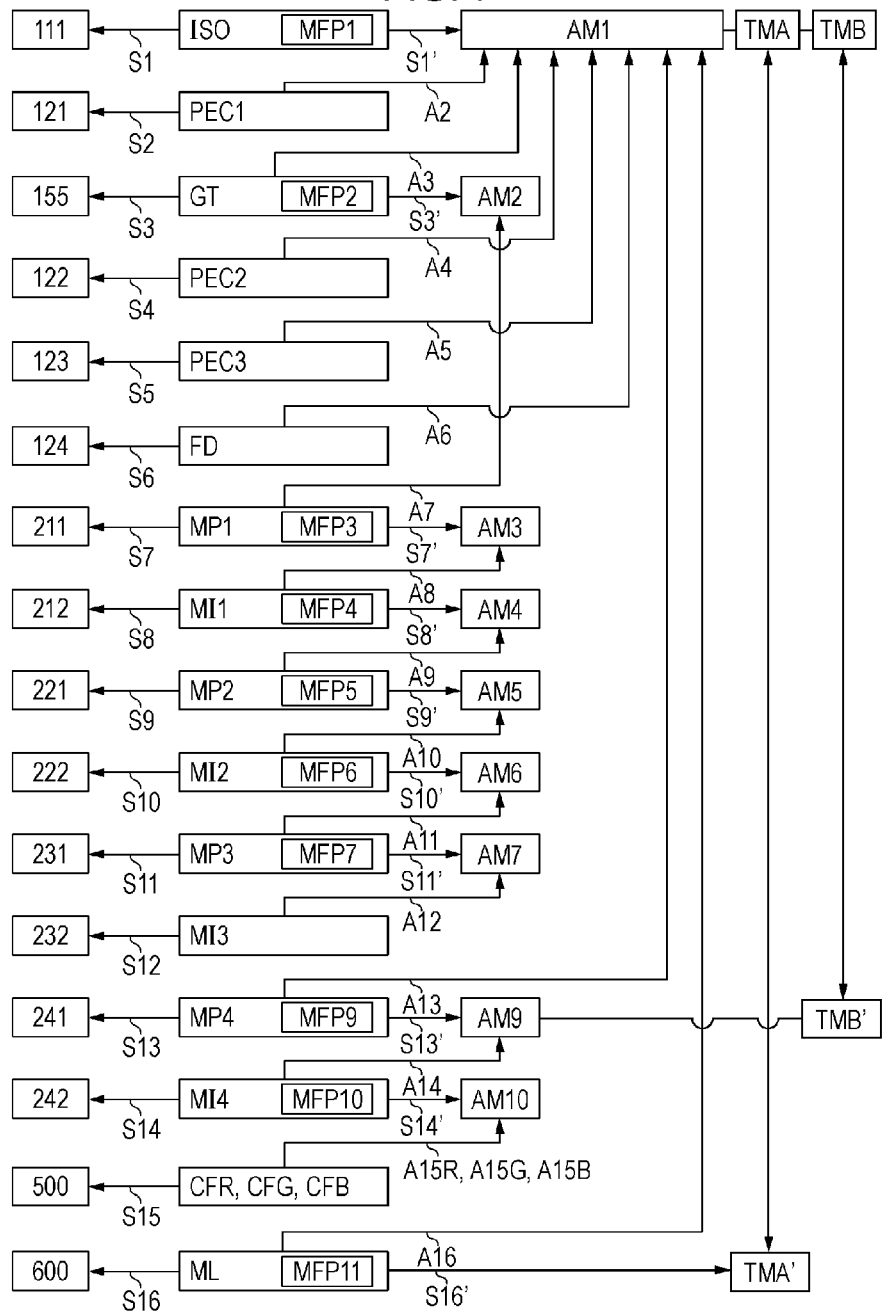
FIG. 7 is a schematic diagram illustrating an example of a method for manufacturing the photoelectric conversion device according to the present invention.

A second embodiment is different from the first embodiment in a method of forming the fourth metal layer 240. A method of forming other constituent members can be similar to that in the first embodiment, and a description thereof is thus omitted. Specifically, processes up to the formation of the third metal layer 230 can be performed in a manner similar to the processes (a) to (g-3) in the first embodiment. In addition, processes after the formation of the intermediate film 400 can be performed in a manner similar to the processes (h) and (i) in the first embodiment. Thus, only a process (j) as a process to be performed in place of the process (g-4) in the first embodiment will be described. FIG. 7 illustrates, similarly to FIG. 6, the relationships between manufacturing processes and photomasks to be used in the manufacturing processes.

Process (j)

After a fourth insulating layer 340 is formed, a fourth metal layer 240 is formed by sequentially forming a fourth metal plug 241 and a fourth metal interconnection 242. This process can also be performed in a manner similar to the process (g-1), and a brief description thereof will thus be given.

A fourth through-hole (via hole) is formed in the fourth insulating layer 340 using a photomask MP4. In this case, the alignment of the photomask MP4 is performed using the alignment mark AM1 on the wafer 1000 as a reference (A13). Then, the fourth metal plug 241 is formed (S13). The photomask MP4 has a mark forming pattern MFP9. The fourth metal interconnection 242 is formed using a photomask MI4 (S14). The alignment of the photomask MI4 is performed using the alignment mark AM9 on the wafer 1000, which reflects the mark forming pattern MFP9, as a reference (A14). In this way, the fourth metal layer 240 is formed by the process (g-4). The photomask MI4 has a mark forming pattern MFP10, and an alignment mark AM10 is formed (S14').

In this embodiment, unlike the first embodiment, the alignment mark AM8 is not used for the alignment of the photomask MP4. Thus, the photomask M13 need not have a mark forming pattern MFP8.

In the first embodiment, the fourth metal layer 240 is formed by performing alignment a total of eight times including A3, A7, A8, A9, A10, A11, A12, and A13. Thus, there is a high probability that the relative positional relationship between the fourth metal interconnection 242 and the micro lens 600, which has been formed by performing alignment only once (A16) using the alignment mark AM1 as a reference, is largely deviated from the design value. If the relative positional relationship between the micro lens 600 and the fourth metal layer 240, which is the metal layer closest to the micro lens 600, is largely deviated from the design value, the following problem may arise. As illustrated in FIG. 10B, part of light collected by the micro lens 600 may be blocked by the fourth metal layer 240, resulting in a reduction in use efficiency of incident light or causing stray light. In FIG. 10B, dotted lines indicated near the metal layers 210 to 240 represent the positions of the metal layers 210 to 240 illustrated in FIG. 2B, that is, the correct positions of the metal layers 210 to 240. There is also a high probability that the relative positional relationship between the micro lens 600 and the color filter 500 formed by performing alignment using as a reference the alignment mark AM10 formed at the same time as the formation of the fourth metal layer 240 is largely deviated from the design value. Thus, part of light collected by the micro lens 600 may be transmitted through the color filter 500 of a wrong color, and thereby color mixture may occur.

According to this embodiment, in the process (j), the alignment of the photomask MP4 is performed using as a reference the alignment mark AM1 formed in the process (b) using the photomask ISO. In addition, the alignment of the photomask MI4 is performed using as a reference the alignment mark AM9 formed using the photomask MP4. In addition, as in the first embodiment, the alignment of the photomask ML is performed using as a reference the alignment mark AM1 formed in the process (b) using the photomask ISO. In this manner, the photomask MP4 to be used to form the fourth metal layer 240 and the photomask ML to be used to form the micro lens 600 are aligned using the same alignment mark AM1 as a reference. Alignment is performed only once, namely, A14, to form the photomask MI4. Therefore, the deviation of the relative positional relationship between the fourth metal layer 240 and the micro lens 600 from the design value can be reduced, and a photoelectric conversion device 1 having a value close to the design value and having desired performance can be obtained. This embodiment is especially suitable when the light receiving section 10 has two or more metal layers including the N-th metal layer between the wafer 1000 and the micro lens 600.

Third Embodiment

Figure 9:
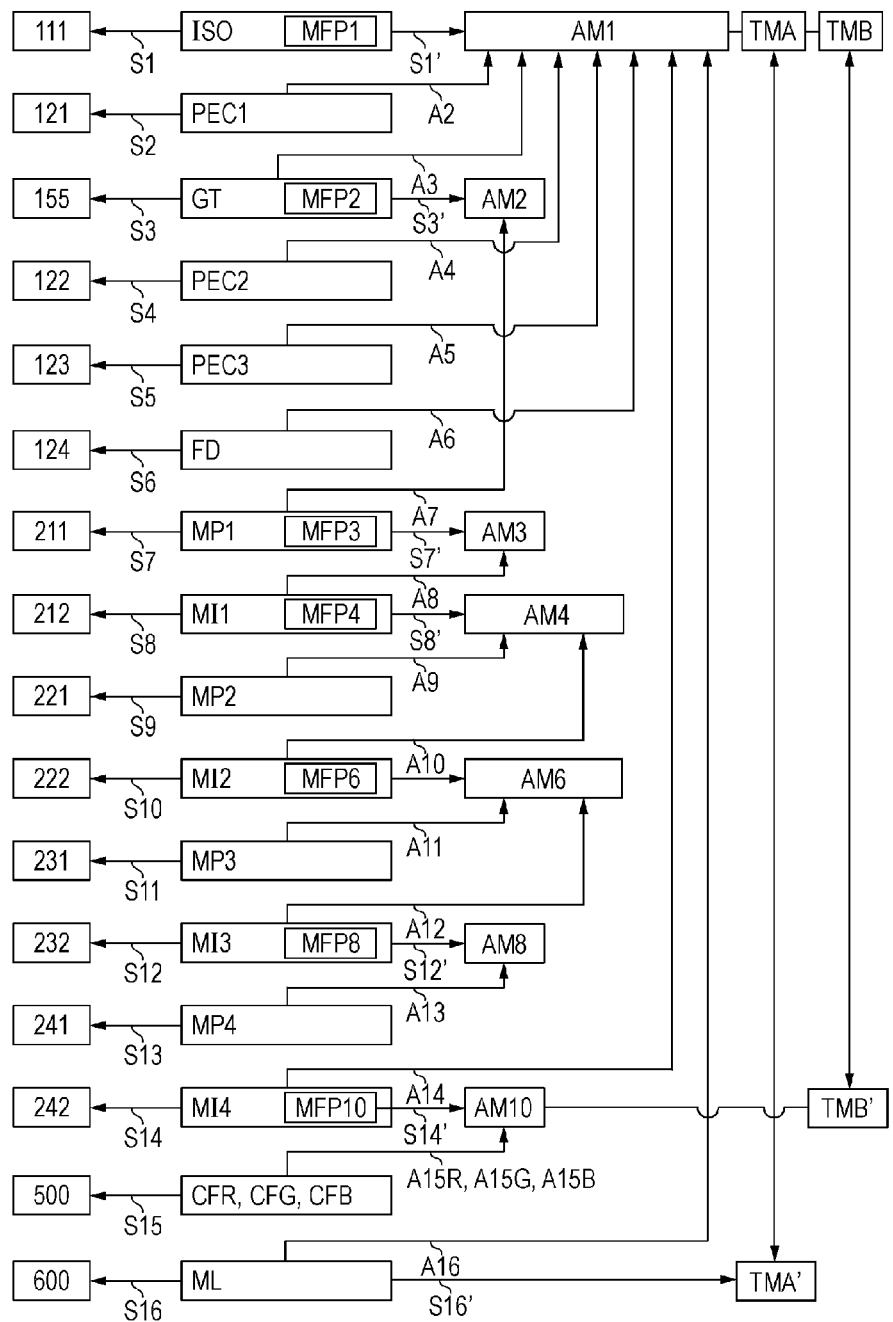
FIG. 9 is a schematic diagram illustrating an example of the method for manufacturing the photoelectric conversion device according to the present invention.

A third embodiment is different from the first and second embodiments in a method of forming a metal structure, particularly in that the fourth metal interconnection 242 of the fourth metal layer 240 is formed using a damascene method. In the third embodiment, by way of example, the first to third metal layers are also formed using a damascene method; however, the first to third metal layers may be used using a method similar to that in the first embodiment. Processes up to the formation of the first metal plug 211 can be performed in a manner similar to the processes (a) to (f) in the first embodiment. In addition, processes after the formation of the intermediate film 400 can be performed in a manner similar to the processes (h) and (i) in the first embodiment. Thus, processes (k-1), (k-2), and (k-3) to be performed in place of the processes (g-1), (g-2), and (g-3) in the first embodiment, respectively, will be briefly described, and a process (k-4) to be performed in place of the process (g-4) will be described in detail. FIG. 9 illustrates, similarly to FIG. 6, the relationships between manufacturing processes and photomasks to be used in the manufacturing processes.

Process (k-1)

The first metal plug 211 can be formed in a manner similar that in the process (g-1) in the first embodiment. A fifth insulating layer 350 is formed on top of the first insulating layer 310 on which the first metal plug 211 has been formed. Then, a first metal interconnection 212 is formed in the fifth insulating layer 350 using a single damascene method. A trench to be formed in the fifth insulating layer 350 is patterned using a photomask MI1. The alignment of the photomask MI1 is performed using the alignment mark AM2 as a reference. The photomask MI1 has a mark forming pattern MFP4, and an alignment mark AM4 is formed on top of the wafer 1000 at the same time as the formation of the first metal interconnection 212.

Process (k-2)

A second insulating layer 320 is formed on top of the fifth insulating layer 350. Then, a second metal plug 221 and a second metal interconnection 222 are formed in the fifth insulating layer 350 using a dual damascene method having a via hole forming step and a trench forming step. A second hole (via hole) to be formed in the fifth insulating layer 350 is patterned using the photomask MP2. A trench to be formed in the fifth insulating layer 350 is patterned using the photomask MI2. The alignment of the photomask MP2 and the alignment of the photomask MI2 are performed using the alignment mark AM4 formed on top of the wafer 1000 as a reference. The photomask MI2 has a mark forming pattern MFP6, and an alignment mark AM6 is formed on top of the wafer 1000 at the same time as the formation of the second metal interconnection 222.

Process (k-3)

A third insulating layer 330 is formed on top of the second insulating layer 320. Then, a third metal plug 231 and a third metal interconnection 232 are formed in the third insulating layer 330 using a dual damascene method having a via hole forming step and a trench forming step. A third hole (via hole) to be formed in the third insulating layer 330 is patterned using the photomask MP3. A trench to be formed in the third insulating layer 330 is patterned using the photomask M13. The alignment of the photomask MP3 and the alignment of the photomask M13 are performed using the alignment mark AM6 formed on top of the wafer 1000 as a reference. The photomask M13 has a mark forming pattern MFP8, and an alignment mark AM8 is formed on top of the wafer 1000 at the same time as the formation of the third metal interconnection 232.

Process (k-4)

Figure 8:
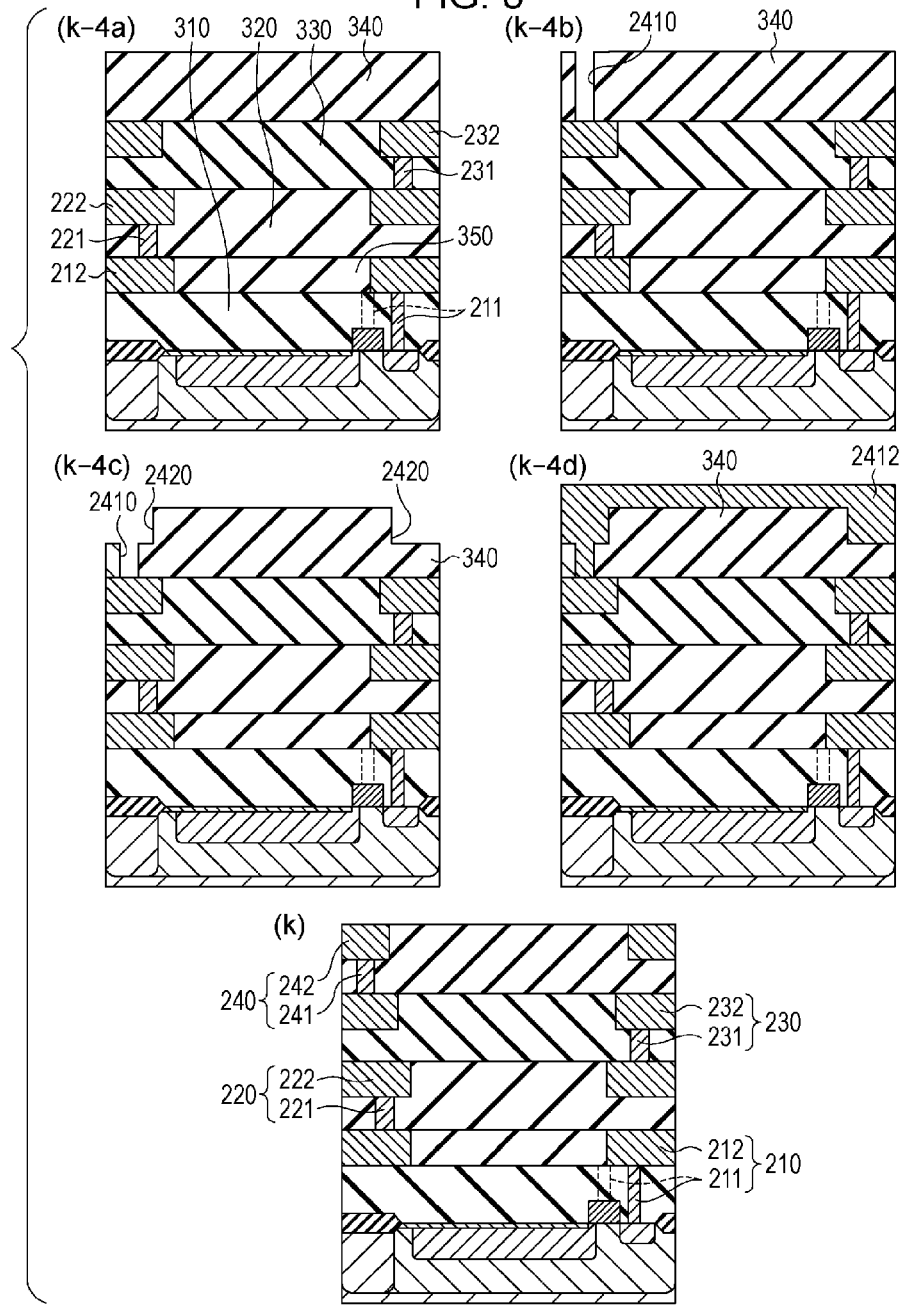
FIG. 8 is a schematic diagram illustrating an example of a method for manufacturing the photoelectric conversion device according to the present invention.

A fourth insulating layer 340 is formed on top of the wafer 1000 (on top of the third insulating layer 330 and the third metal interconnection 232) (part (k-4a) of FIG. 8). After the fourth insulating layer 340 has been formed, the first insulating layer 310 can be planarized, if necessary, using a method such as reflow, CMP, or etch-back. Alternatively, the fourth insulating layer 340 may be formed using SOG. The fourth insulating layer 340 is preferably made of a material containing silicon oxide as a main component, such as silicon oxide, BPSG, BSG, or PSG, and is particularly preferably made of silicon oxide.

Then, a photoresist film is coated on top of the fourth insulating layer 340. The photoresist film is patterned using a photomask MP4. In this case, the alignment of the photomask MP4 is performed using the alignment mark AM8 on the wafer 1000 as a reference.

The fourth insulating layer 340 patterned using the photomask MP4 is etched using the photoresist film as a mask. In this way, a via hole forming step is performed in which a fourth through-hole 2410 (via hole) is formed in the fourth insulating layer 340 so as to reach the third metal interconnection 232 (part (k-4b) of FIG. 8).

The photoresist film patterned using the photomask MP4 is removed, and a photoresist film is coated again. Then, the photoresist film is patterned using a photomask MI4. In this case, the alignment of the photomask MI4 is performed using the alignment mark AM1 on the wafer 1000 as a reference. The fourth insulating layer 340 is etched again using as a mask the photoresist film patterned using the photomask MI4. In this way, a trench forming step is performed in which a trench 2420 that is continuous with the fourth through-hole 2410 formed using the photomask MP4 is formed in the fourth insulating layer 340 (part (k-4c) of FIG. 8).

Here, by way of example, the so-called via-first approach is employed in which the fourth through-hole 2410 (via hole) is formed prior to the formation of the trench 2420; however, the so-called trench-first approach may be employed. When the trench-first approach is employed, first, a trench may be formed, and a fourth through-hole may be formed in a bottom portion of the trench.

A metal film 2412 is formed on top of the fourth insulating layer 340 so that the fourth through-hole 2410 and the trench 2420 are filled with the metal film 2412 (part (k-4d) of FIG. 8). Then, the metal film 2412 is removed using CMP or a similar method until the fourth insulating layer 340 is exposed. Thus, the fourth metal plug 241 to be connected to the third metal interconnection 232 and the fourth metal interconnection 242 are formed at the same time.

In the above way, a metal structure having the first metal layer 210, the second metal layer 220, the third metal layer 230, and the fourth metal layer 240 can be formed (part (k) of FIG. 8).

In the example illustrated in FIG. 9, the alignments in the via hole forming step and the trench forming step for each of the second metal layer 220 and the third metal layer 230 are performed using the same alignment marks (AM4, AM6) as references. However, an alignment mark may be formed at the same time as the earlier one of the via hole forming step and the trench forming step, and alignment in the later step may be performed using the formed alignment mark as a reference.

In the first embodiment, since the alignment mark AM1 is shielded by a metal film for forming a fourth metal pattern, it is difficult to perform the alignment of the photomask MI4 using the alignment mark AM1 as a reference. In this embodiment, in contrast, since the fourth metal interconnection 242 is formed using a damascene method, the substantial pattern of the fourth metal interconnection 242 is determined at the time of forming a trench. At the time of forming a trench, the alignment mark AM1 can be optically detected through the fourth insulating layer 340. In this embodiment, therefore, it is possible to perform the alignment of the photomask MI4 using the alignment mark AM1 as a reference. In the illustrated example, by way of example, the fourth metal layer 240 is formed using a dual damascene method. However, the fourth metal interconnection 242 may be formed using a single damascene method. Also in this case, similar advantages can be obtained. The second metal interconnection 222 and the third metal interconnection 232 may be formed using a single damascene method. This embodiment is especially suitable when the main component of the metal interconnection in each metal layer is copper.

According to this embodiment, in the process (k-4), the alignment of the photomask MP4 is performed using as a reference the alignment mark AM8 formed in the process (h) using the photomask M13. Further, the alignment of the photomask MI4 is performed using as a reference the alignment mark AM1 formed using the photomask ISO. In addition, as in the first embodiment, the alignment of the photomask ML is performed using as a reference the alignment mark AM1 formed in the process (b) using the photomask ISO.

In this way, the photomask MI4 to be used to form the fourth metal interconnection 242 in the fourth metal layer 240, which is the uppermost metal layer, and the photomask ML to be used to form a micro lens are aligned using the same alignment mark, i.e., the alignment mark AM1, as a reference. Thus, the deviation of the relative positional relationship between the fourth metal interconnection 242 and the micro lens from the design value can be reduced, and a photoelectric conversion device 1 having a value close to the design value and having desired performance can be obtained.

In addition, unlike the second embodiment, the alignment of the photomask MP4 to be used to form the fourth metal plug 241 in the fourth metal layer 240 is performed using as a reference the alignment mark AM8 formed when the third metal interconnection 232 to which the fourth metal plug 241 is connected is formed. Thus, the deviation of the relative positional relationship between the fourth metal plug 241 and the third metal interconnection 232 from the design value can be reduced, and a photoelectric conversion device 1 having a value close to the design value and having desired electrical performance can be obtained.

Fourth Embodiment

A fourth embodiment can be applied to the first, second, and third embodiments, and will be described with reference to FIGS. 4, 5, and 7 and FIGS. 10A to 10C by taking the first embodiment as an example.

In addition to the alignment mark AM1, a test mark TMA and a test mark TMB are formed using the mark forming pattern MFP1 of the photomask ISO used in the process (b). In addition to the alignment mark AM10, a test mark TMB' is formed using the mark forming pattern MFP10 of the photomask MI4 used in the process (g-4). The photomask ML used in the process (i) has a mark forming pattern MFP11, and a test mark TMA' is formed at the same time as the patterning of a micro lens (S16').

The test mark TMA and the test mark TMA' can be formed at substantially the same position on the wafer 1000. Likewise, the test mark TMB and the test mark TMB' can be formed at substantially the same position on the wafer 1000. In the illustrated example, as illustrated in FIG. 1A, the test marks TMA and TMB have substantially rectangular loop shaped patterns, and the test marks TMA' and TMB' have substantially rectangular dot shaped patterns. When alignment is correctly performed in each process, as illustrated in FIG. 1A, the center of the test mark TMA' and the center of the test mark TMA are aligned with each other, and the test mark TMA' looks to be surrounded by the test mark TMA when the wafer 1000 is observed from above. As illustrated in FIG. 1A, furthermore, when the wafer 1000 is observed from above, the center of the test mark TMB' and the center of the test mark TMB are aligned with each other, and the test mark TMB' looks to be surrounded by the test mark TMB.

In this manner, the positional relationship between the test marks TMA and TMA' is observed to check whether the positional relationship between the photoelectric conversion element 130 and the micro lens 600 is correct. Likewise, the positional relationship between the test marks TMB and TMB' is observed to check whether the positional relationship between the photoelectric conversion element 130 and the fourth metal layer 240 is correct.

Here, by way of example, the test pattern TMB' to be used to check the positional relationship between the photoelectric conversion element 130 and the fourth metal layer 240 is formed using the photomask MI4 at the same time as the formation of the fourth metal interconnection 242. However, as illustrated in FIG. 7 or 9, the pattern TMB' may be formed using the test photomask MP4 at the same time as the formation of the fourth metal plug 241 or at the same time as the formation of a via hole in which the fourth metal plug 241 is to be formed.

Although not illustrated, a loop-shaped test mark TMC may be formed using, for example, the mark forming pattern MFP9 or MFP10 of the photomask MI4, and a dot-shaped test mark TMC' may be used using the photomask ML. By observing the positional relationship between the test marks TMC and TMC', it may be checked whether the positional relationship between the fourth metal interconnection 242 and the micro lens 600 is correct.

If alignment is not correctly performed in each process, as illustrated in FIG. 10A, the center of the test mark TMA' and the center of the test mark TMA are not aligned with each other, and the test mark TMA' looks to be displaced from the test mark TMA when the wafer 1000 is observed from above. As illustrated in FIG. 10A, furthermore, when the wafer 1000 is observed from above, the center of the test mark TMB' and the center of the test mark TMB are not aligned with each other, and the test mark TMB' looks to be displaced from the test mark TMB.

In this manner, by taking measure to check the positional relationship between the micro lens 600 and the isolation insulator 111 or the positional relationship between the micro lens 600 and the fourth metal layer 240, it is possible to test the optical performance of the photoelectric conversion device 1.

When this embodiment is applied to the first embodiment and the third embodiment, as illustrated in FIGS. 6 and 9, preferably, the test mark TMB' is formed using the mark forming pattern MFP10 of the photomask MI4. On the other hand, when this embodiment is applied to the second embodiment, preferably, as illustrated in FIG. 7, the test mark TMB' is formed using the mark forming pattern MFP9 of the photomask MP3 although the test mark TMB' may be formed using the mark forming pattern MFP10 of the photomask MI4.

In the illustrated example, the test marks TMA and TMB are shaped in loops, and the test marks TMA' and TMB' are shaped in dots. However, the present invention is not limited to this example. That is, various changes may be made, as desired, as long as it can be checked whether the position of the micro lens 600 with respect to the photoelectric conversion element 130 is correct or whether the position of the micro lens 600 with respect to the fourth metal layer 240 is correct. While the alignment mark AM1 and the test marks TMA and TMB are used as different marks, the alignment mark AM1 may be used as a test mark TMA. The same applies to the alignment mark AM10 (or AM9) and the test mark TMB'. Both the set of test marks TMA and TMA' and the set of test marks TMB and TMB' may not necessarily be provided, and only one set of test marks may be provided. In this case, at least the set of test marks TMA and TMA' is preferably provided.

If it is determined, as a result of the observation of test marks, that the optical performance is outside the allowable range, the following operation is preferably performed. After the micro lens 600 is removed by wet etching or the like, the micro lens 600 is formed again in a manner similar to that in the process (i). Thus, a photoelectric conversion device having desired optical performance can be manufactured, even if the optical performance of the apparatus has been once determined to be outside the standard range, without money already spent on manufacturing going to waste, and therefore cost reduction can be achieved.

While, as described above, the mark sections 30 can be arranged outside scribe lines, as in the illustrated example, the mark sections 30 are preferably arranged inside scribe lines. Thus, after the wafer has been diced (into chips), it can be easily determined (tested) whether the optical performance of each photoelectric conversion device 1 is within or outside the standard range, by using the test marks TMA and TMA' and/or the test marks TMB and TMB'. If there is no need to perform the above test after dicing, the mark sections 30 may be arranged outside scribe lines to reduce the size of the photoelectric conversion devices 1.

Fifth Embodiment

Figure 11A:
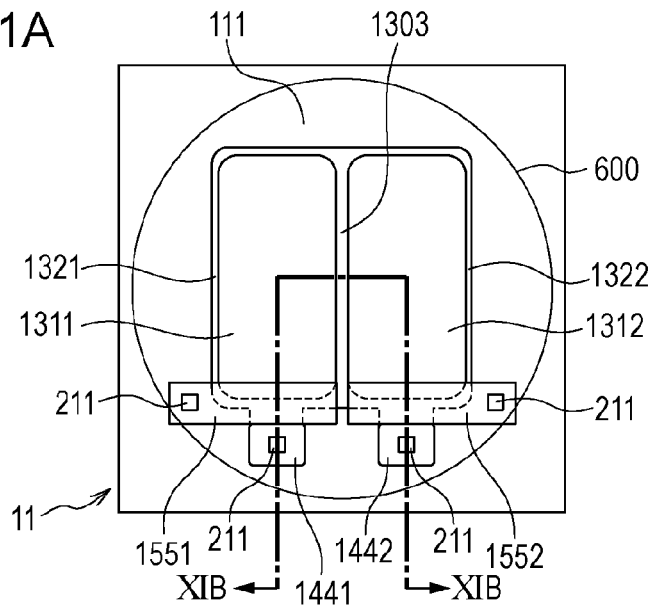
FIGS. 11A and 11B are schematic diagrams illustrating an example of a photoelectric conversion device according to the present invention.
Figure 11B:
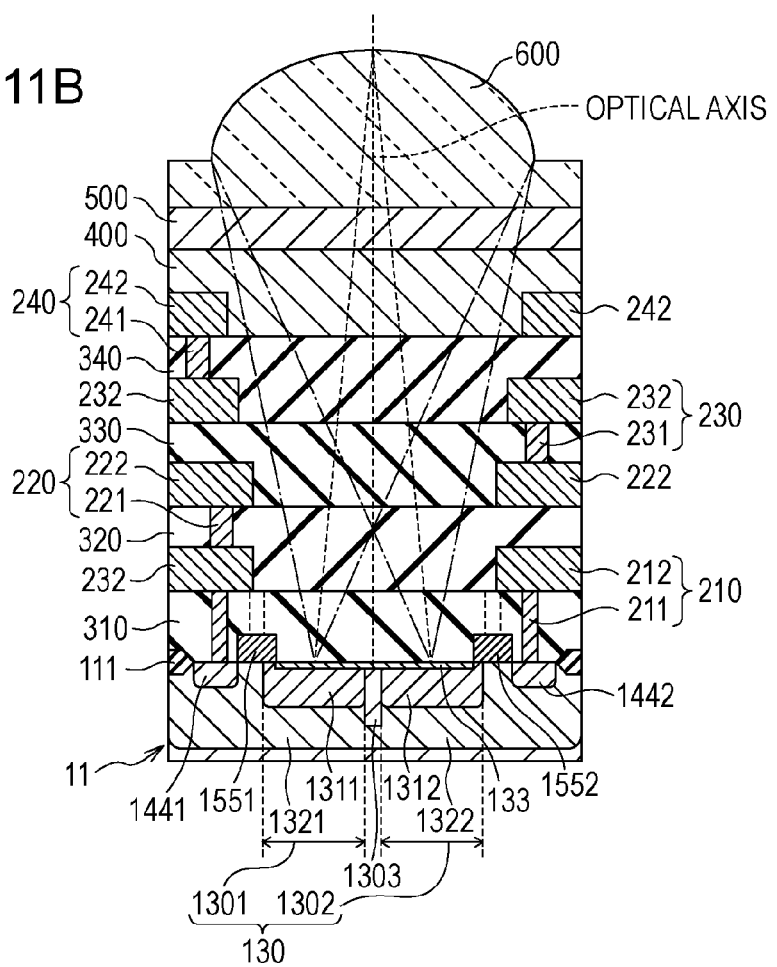

A fifth embodiment provides an example of a photoelectric conversion device that can be particularly effectively manufactured using a method according to the present invention. An example of this embodiment will be described with reference to FIGS. 11A and 11B. FIG. 11A is a plan view of one pixel according to this embodiment, and FIG. 11B is a cross-sectional view of the light receiving unit 11, taken along line XIB-XIB in FIG. 11A.

One photoelectric conversion element 130 corresponding to one micro lens has a plurality of photoelectric conversion units. In the following description, by way of example, the photoelectric conversion element 130 has two photoelectric conversion units, namely, a first photoelectric conversion unit 1301 and a second photoelectric conversion unit 1302. The photoelectric conversion element 130 may also have more than two photoelectric conversion units. The first photoelectric conversion unit 1301 and the second photoelectric conversion unit 1302 are isolated from each other by a partition 1303. The first photoelectric conversion unit 1301 and the second photoelectric conversion unit 1302 individually generate and accumulate signal charge.

The first photoelectric conversion unit 1301 and the second photoelectric conversion unit 1302 have first-conductivity-type first semiconductor regions 1311 and 1312, respectively, each of which functions as a photoelectric conversion region and an accumulation region. For convenience of description, the first semiconductor region 1311 of the first photoelectric conversion unit 1301 is referred to as the "first accumulation region 1311", and the first semiconductor region 1312 of the first photoelectric conversion unit 1302 is referred to as the "second accumulation region 1312". The first accumulation region 1311 and the second accumulation region 1312 are isolated from each other through the partition 1303, which is a second-conductivity-type semiconductor region. The first photoelectric conversion unit 1301 and the second photoelectric conversion unit 1302 have second-conductivity-type second semiconductor regions 1321 and 1322, respectively, which are isolated from each other through the partition 1303. In the illustrated example, the partition 1303 has an impurity concentration substantially equal to the second-conductivity-type second semiconductor regions 1321 and 1322. The partition 1303 is formed in the impurity region 121 formed in the process (c) in the first embodiment by implanting donor ions using a portion corresponding to the partition 1303 as a mask in the process (e-1) in the first embodiment. That is, the partition 1303 is formed as a portion of the impurity region 121 where substantially no donor ions are implanted. The partition 1303 may have an impurity concentration higher than the second-conductivity-type second semiconductor regions 1321 and 1322. In this case, the second-conductivity-type partition 1303 having an impurity concentration higher than the second semiconductor regions 1321 and 1322 functions as a potential barrier between the second semiconductor regions 1321 and 1322. The partition 1303 functioning as a potential barrier can be formed using, for example, the photomask PEC1, at the same time as the formation of the seventh semiconductor region 112 (not illustrated in FIG. 11B) in the isolation region 110 described with reference to FIG. 2B. In this case, the alignment of the photomask PEC1 is preferably performed using the alignment mark AM1 as a reference. Like the isolation insulator 111 in the isolation region 110, the partition 1303 may be formed using an insulator (partition insulator). In this case, the partition insulator of the partition 1303 is preferably formed at the same time as the formation of the isolation insulator 111 in the isolation region 110. The partition insulator of the partition 1303 may be formed at the same time as the formation of the isolation insulator 111, and, in addition, the second-conductivity-type semiconductor region of the partition 1303 may be formed by implanting acceptor ions into the active region 120 at the same time as the implantation of acceptor ions into the isolation region 110.

In the illustrated example, a plurality of fifth semiconductor regions, each of which functions as a channel region, and a plurality of fourth semiconductor region, each of which functions as a floating diffusion region, are also disposed so as to correspond to the photoelectric conversion units 1301 and 1302. A first floating diffusion region 1441 is connected to the first accumulation region 1311 through a first transfer gate having a first transfer gate electrode 1551. A second floating diffusion region 1442 is connected to the second accumulation region 1312 through a second transfer gate having a second transfer gate electrode 1552.

A micro lens 600 is formed so that the optical axis of the micro lens 600 corresponds to the partition 1303, that is, the optical axis of the micro lens 600 extends through the partition 1303.

A signal corresponding to the signal charge generated and accumulated in the first photoelectric conversion unit 1301 and a signal corresponding to the signal charge generated and accumulated in the second photoelectric conversion unit 1302 are obtained through the first transfer gate and the second transfer gate, respectively. By comprising the obtained signals, the photoelectric conversion device 1 can detect a focal point using a phase difference detection method. The photoelectric conversion device 1 according to this embodiment is a multi-function device having functions of an imaging device and a distance measurement device (focus detection device).

An imaging system such as a still camera or a video camera can be constructed using the above multi-function device. The imaging system has, in addition to the multi-function device, a control unit that outputs a drive signal for driving a lens optical system. A focal point can be detected in the following way. In the imaging system, it is determined that a defocus state is obtained if the signal based on the signal charge generated and accumulated in the first photoelectric conversion unit 1301 and the signal based on the signal charge generated and accumulated in the second photoelectric conversion unit 1302 have different levels. If the signal based on the signal charge generated and accumulated in the first photoelectric conversion unit 1301 and the signal based on the signal charge generated and accumulated in the second photoelectric conversion unit 1302 have the same level, it is determined that an in-focus state is obtained. Thus, if it is determined that a defocus state is obtained, the control unit outputs a drive signal for driving the lens optical system so that the signals based on the signal charges generated and accumulated in the photoelectric conversion units 1301 and 1302 have the same level. An imaging device and an imaging system that are capable of detecting a focal point in the manner described above are described in Japanese Patent Laid-Open No. 2001-250931 and Japanese Patent Laid-Open No. 2002-165126.

In FIG. 11B, rays of light incident on the first photoelectric conversion unit 1301 are schematically indicated by dot-and-dash lines, and rays of light incident on the second photoelectric conversion unit 1302 are schematically indicated by two-dot chain lines. If the optical axis of the micro lens 600 is significantly offset from the partition 1303, there is a high probability that a defocus state and an in-focus state may be incorrectly determined.

A method for manufacturing an imaging device according to this embodiment can be performed in a manner similar to manufacturing methods in the first to fourth embodiments. That is, alignment (A4) in the process (S4) of forming the photoelectric conversion element 130 having the photoelectric conversion units 1301 and 1302 is performed using as a reference the alignment mark AM1 formed at the same time as the formation of the isolation region 110. Furthermore, alignment (A16) in the process (S16) of forming the micro lens 600 is performed using as a reference the alignment mark AM1 formed at the same time as the formation of the isolation region 110. Therefore, the deviation of the optical axis of the micro lens 600 from the design value with respect to the partition 1303 of the photoelectric conversion element 130 can be reduced, and an imaging device (multi-function device) with high focus detection accuracy can be obtained.

Sixth Embodiment

Figure 12:
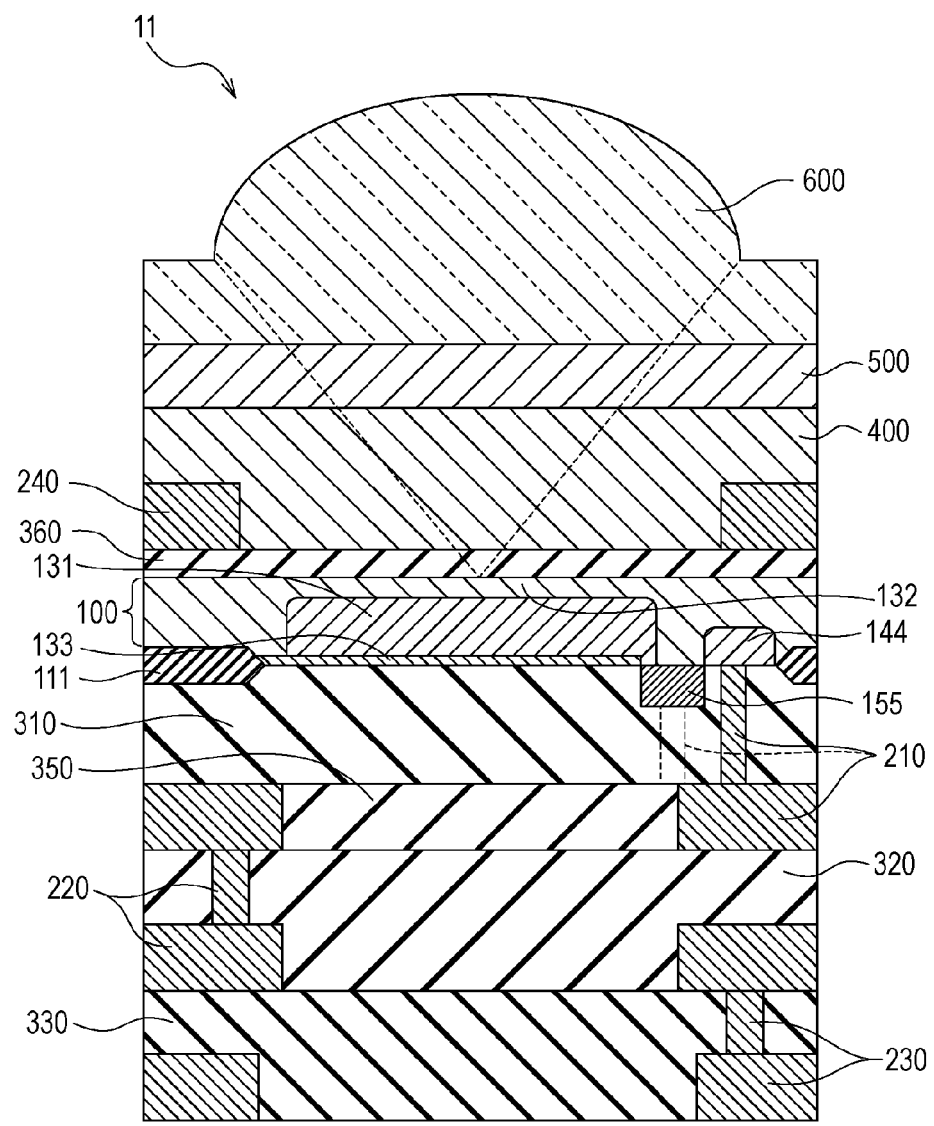
FIG. 12 is a schematic diagram illustrating an example of a photoelectric conversion device according to the present invention.

In the first embodiment, the so-called front side illuminated CMOS sensor has been described. A sixth embodiment provides a so-called back side illuminated CMOS sensor. FIG. 12 is a cross-sectional view of the light receiving unit 11 according to this embodiment, taken along line A-B in FIG. 1A.

The back side illuminated CMOS sensor can also be manufactured in a way similar to that described with reference to the first to third embodiments. Only a difference when the third embodiment is employed will be described. Processes up to the process (k-3) in the third embodiment can be performed in a similar way.

After the process (k-3), the wafer 1000 is made as thin as about 1 to 100 µm, typically, about 10 µm, from the back side of the wafer 1000 using CMP or a similar method. After that, an insulating film 360 is formed on the back side of the wafer 1000. A metal film is formed on top of the insulating film 360, and the metal film is patterned using the photomask MI4 to form a fourth metal layer 240. In this case, the alignment of the photomask MI4 is preferably performed using the alignment mark AM1 as a reference. Alternatively, the alignment of the photomask M14 may be performed using the alignment mark AM2 as a reference. If necessary, the fourth metal layer 240 may be electrically connected to the wafer 1000. The photomask MI4 has a mark forming pattern MFP10, and an alignment mark AM10 is formed at the same time as the formation of the fourth metal layer 240. In a back side illuminated CMOS sensor, therefore, the N-th metal layer (the fourth metal layer 240) out of N metal layers, which is closest to the micro lens 600, is disposed on the back side of the wafer 1000. The remaining N−1 metal layers (the first metal layer 210, the second metal layer 220, and the third metal layer 230) are disposed on the front side of the wafer 1000.

An intermediate film 400 is formed on top of the fourth metal layer 240, and a color filter array is formed on top of the intermediate film 400 using photomasks CFG, CFR, and CFB. The alignment of the photomasks CFG, CFR, and CFB may be performed using the alignment mark AM10 as a reference. Then, a micro-lens array is formed on top of the color filter array using a photomask ML. The alignment of the photomask ML is performed using the alignment mark AM1 as a reference. Therefore, the deviation of the relative positional relationship between the micro lens and the photoelectric conversion element from the design value can be reduced, and a photoelectric conversion device 1 having a value close to the design value and having desired optical performance can be obtained.

While the first to sixth embodiments have been described as examples, the processes described in each embodiment may be used in combination as appropriate, or some of the processes in each embodiment may be changed.

In the foregoing description, a photolithography technique in which a photomask is used as a patterning tool has been described as a patterning technique. However, the patterning technique may be a maskless patterning technique in which an energy ray to be scanned in accordance with pattern data to be scanned is used as a patterning tool. For example, when an electron beam is used as an energy ray, a pattern for patterning a semiconductor region and a constituent member to be formed in the light receiving section 10 is drawn on a photoresist film formed on a wafer. A mark forming pattern for forming an alignment mark to be formed in the mark section 30 is also drawn on the same photoresist film so as to be continuous with the drawn pattern. An alignment mark can be formed using the patterned photoresist film at the same time as the formation of the semiconductor region and the constituent member. In this case, alignment is performed by, for example, detecting an alignment mark on the wafer and setting reference coordinates of pattern data on the basis of the positional relationship between the wafer and the source of electron beams serving as patterning tools. Then, the drawing in the light receiving section 10 and the drawing in the mark section 30 are performed using the same reference coordinates as references. Therefore, even if the time of drawing in the light receiving section 10 and the time of drawing in the mark section 30 do not accurately match, the patterning in the light receiving section 10 and the patterning in the mark section 30 can be regarded as being performed in substantially the same process.

For example, if the photoelectric conversion element 130 is formed by exposing a photoresist film to an electron beam ray, reference coordinates may be set using as a reference the alignment mark AM1 formed in the process of forming the isolation region 110.

A patterning technique based on energy rays is not limited to a photolithography technique based on electron beams. For example, a patterning technique may be used in which a member to be processed is directly processed by irradiating the member to be processed with focused ion beams or laser beams to be scanned in accordance with pattern data. Also in this case, the processing in the light receiving section 10 and the processing in the mark section 30 are performed using the same standard coordinates as references. Therefore, even if the time of processing in the light receiving section 10 and the time of processing in the mark section 30 do not accurately match, the processing in the light receiving section 10 and the processing in the mark section 30 can be regarded as being performed in substantially the same process.

Similarly, a patterning technique may be used in which a liquid ejection head to be scanned in accordance with pattern data is used as a patterning tool, such as a dispensing method or an inkjet method. Also in this case, an alignment mark is detected, the reference coordinates of pattern data are set on the basis of the current positional relationship between a wafer and an inkjet head, and the liquid ejection head is scanned using the reference coordinates.

For example, the color filter 500 may be formed using an inkjet method. In this case, the alignment of the inkjet head may be performed using as a reference the alignment mark AM10 formed in the process of forming the N-th metal layer. Then, a material of which the color filter 500 is formed is not ejected onto the alignment mark AM1.

Alternatively, a patterning technique may be used in which a film deposition is performed using a metal mask having an opening as a patterning tool. A patterning technique may also be employed in which coating is performed using a plate as a patterning tool, such as a screen printing method. A patterning technique may also be employed in which a mold is used as a patterning tool, such as a molding method or a nanoimprinting method. The above techniques may be used in combination, as desired. Alternatively, a constituent member may be formed on a wafer, without performing patterning on the wafer, but by preparing a sheet having the constituent member formed thereon in advance and bonding the sheet to the wafer. Also in a case where a metal mask, a plate, a mold, or a sheet is used, it is necessary to align the metal mask, the plate, the mold, or the sheet with the previously formed semiconductor region or constituent member.

For example, if the micro lens 600 is formed using a plate, a mold, or a sheet, the alignment of the plate, the mold, or the sheet may be performed as a reference the alignment mark AM1 formed in the process of forming the isolation region 110.

According to the foregoing embodiments, therefore, a photoelectric conversion device in which the position of a micro lens with respect to a photoelectric conversion element is accurately controlled can be obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-177126 filed Aug. 12, 2011, which is hereby incorporated by reference herein in its entirety.

What is claimed is:

1. A method for manufacturing a photoelectric conversion device, comprising the processes of:
    forming an isolation region on a semiconductor wafer;
    forming a photoelectric conversion element in an active region defined by the isolation region;
    forming a transistor on the semiconductor wafer;
    forming a member on the semiconductor wafer; and
    forming a micro lens over the photoelectric conversion element,
    wherein alignment in the process of forming the photoelectric conversion element and alignment in the process of forming the micro lens are performed using an alignment mark formed in the process of forming the isolation region,
    wherein alignment in the process of forming the member is performed using an alignment mark formed in the process of forming the transistor, and
    wherein the transistor and the micro lens are formed on the same side of the semiconductor wafer.

2. The method according to claim 1, further comprising processes of forming N metal layers, where N≥2,
    the processes of forming the N metal layers including
        a process of forming an N-th metal layer that is formed last among the N metal layers,
    wherein alignment in the process of forming the N-th metal layer is performed using the alignment mark formed in the process of forming the isolation region.

3. The method according to claim 1, wherein
    alignment in the process of forming the transistor is performed using the alignment mark formed in the process of forming the isolation region.

4. The method according to claim 1, further comprising a process of forming a color filter over the photoelectric conversion element, the process of forming the color filter being performed prior to the process of forming the micro lens,
    wherein the alignment in the process of forming the micro lens is performed by detecting the alignment mark formed in the process of forming the isolation region without interposition of the color filter.

5. The method according to claim 1, wherein
    in the process of forming the photoelectric conversion element, the photoelectric conversion element is formed so as to have a plurality of photoelectric conversion units that are isolated from one another by a partition so that the plurality of photoelectric conversion units individually generate and accumulate signal charge, and
    in the process of forming the micro lens, the micro lens is formed so that an optical axis of the micro lens corresponds to the partition.

6. The method according to claim 2, wherein
    the process of forming the N-th metal layer includes
        a plug forming step of forming a metal plug in the N-th metal layer, and
        an interconnection forming step of forming a metal interconnection in the N-th metal layer, the metal interconnection in the N-th metal layer being connected to the metal plug in the N-th metal layer, and
    alignment in the plug forming step is performed using the alignment mark formed in the process of forming the isolation region, and alignment in the interconnection forming step is performed using an alignment mark formed in the plug forming step.

7. The method according to claim 2, wherein
    in the process of forming the N-th metal layer, the metal interconnection in the N-th metal layer is formed using a damascene method including a trench forming step, and
    alignment in the trench forming step is performed using the alignment mark formed in the process of forming the isolation region.

8. The method according to claim 2, wherein
    in the process of forming the N-th metal layer, the metal plug in the N-th metal layer and the metal interconnection in the N-th metal layer are formed using a dual damascene method including a via hole forming step and a trench forming step,
    the processes of forming the N metal layers further include a process of forming an (N−1)-th metal layer formed before forming of the N-th metal layer,
    alignment in the via hole forming step is performed using an alignment mark formed in the process of forming the (N−1)-th metal layer, and alignment in the trench hole forming step is performed using the alignment mark formed in the process of forming the isolation region.

9. A method for manufacturing a photoelectric conversion device, comprising the processes of:
   forming an isolation region on a semiconductor wafer;
   forming a photoelectric conversion element in an active region defined by the isolation region;
   forming a transistor on the semiconductor wafer;
   forming one metal layer on the semiconductor wafer;
   forming another metal layer on the semiconductor wafer; and
   forming a micro lens on the semiconductor wafer, so that the micro lens is positioned closer to the another metal layer than the one metal layer, wherein
   alignment in the process of forming the photoelectric conversion element, alignment in the process of forming the transistor, alignment in the process of forming another metal layer, and alignment in the process of forming the micro lens are performed using the alignment mark formed in the process of forming the isolation region, and
   alignment in the process of forming the one metal layer is performed using an alignment mark formed in the process of forming the transistor.

10. The method according to claim 9, wherein the process of forming the one metal layer includes a step of forming a metal plug connected to the transistor, and a step of forming a metal interconnection connected to the metal plug, and
   alignment in the process of forming the metal plug is performed using an alignment mark formed in the process of forming the transistor.

11. The method according to claim 9, further comprising a process of forming a color filter over the photoelectric conversion element, the process of forming the color filter being performed prior to the process of forming the micro lens,
   wherein the alignment in the process of forming the micro lens is performed by detecting the alignment mark formed in the process of forming the isolation region without interposition of the color filter.

12. The method according to claim 9, wherein
   in the process of forming the photoelectric conversion element, the photoelectric conversion element is formed so as to have a plurality of photoelectric conversion units that are isolated from one another by a partition so that the plurality of photoelectric conversion units individually generate and accumulate signal charge, and
   in the process of forming the micro lens, the micro lens is formed so that an optical axis of the micro lens corresponds to the partition.

13. The method according to claim 9, wherein
   in the process of forming the isolation region, a first test mark is formed,
   in the process of forming the micro lens, a second test mark is formed, and
   after the process of forming the micro lens is performed, a relative positional relationship between the first test mark and the second test mark is measured, and if the relative positional relationship is outside an allowable range, the micro lens is removed and thereafter a micro lens is formed again over the photoelectric conversion element.

14. The method according to claim 9, further comprising a process of dividing the semiconductor wafer into a plurality of chips, wherein each of the plurality of chips includes a mark section in which the alignment mark formed in the process of forming the isolation region is formed and a light receiving section in which the photoelectric conversion element is formed.

15. The method according to claim 9, wherein the isolation region is formed using a photomask having a pattern corresponding to the alignment mark formed in the process of forming the isolation region.

16. The method according to claim 9, wherein the another metal layer and the micro lens are formed on one side of the semiconductor wafer.

17. The method according to claim 10, wherein alignment in the process of forming the metal interconnection is performed using an alignment mark formed in the process of forming the metal plug.

18. The method according to claim 16, wherein the transistor and the one metal layer are formed on another side of the semiconductor wafer.

19. A method for manufacturing a photoelectric conversion device, comprising the processes of:
   forming an isolation region on a semiconductor wafer;
   forming a photoelectric conversion element in an active region defined by the isolation region; and
   forming a micro lens over the photoelectric conversion element,
   wherein alignment in the process of forming the photoelectric conversion element and alignment in the process of forming the micro lens are performed using an alignment mark formed in the process of forming the isolation region, and
   wherein in the process of forming the isolation region, a first test mark is formed,
   in the process of forming the micro lens, a second test mark is formed, and
   after the process of forming the micro lens is performed, a relative positional relationship between the first test mark and the second test mark is measured, and if the relative positional relationship is outside an allowable range, the micro lens is removed and thereafter a micro lens is formed again over the photoelectric conversion element.

20. The method according to claim 19, further comprising a process of dividing the semiconductor wafer into a plurality of chips, wherein each of the plurality of chips includes a mark section in which the alignment mark formed in the process of forming the isolation region is formed and a light receiving section in which the photoelectric conversion element is formed.

* * * * *